(12) United States Patent
Lee

(10) Patent No.: US 9,954,194 B2
(45) Date of Patent: Apr. 24, 2018

(54) ORGANIC LIGHT EMITTING DIODE DISPLAY AND MANUFACTURING METHOD THEREOF

(71) Applicant: SAMSUNG DISPLAY CO., LTD., Yongin-si, Gyeonggi-Do (KR)

(72) Inventor: Won Kyu Lee, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 14 days.

(21) Appl. No.: 14/849,986

(22) Filed: Sep. 10, 2015

(65) Prior Publication Data
US 2016/0233285 A1    Aug. 11, 2016

(30) Foreign Application Priority Data
Feb. 5, 2015   (KR) .................. 10-2015-0018154

(51) Int. Cl.
*H01L 29/08* (2006.01)
*H01L 51/52* (2006.01)
*H01L 27/32* (2006.01)

(52) U.S. Cl.
CPC ...... *H01L 51/5228* (2013.01); *H01L 27/3246* (2013.01); *H01L 27/3258* (2013.01); *H01L 27/3262* (2013.01); *H01L 2227/323* (2013.01); *H01L 2251/558* (2013.01)

(58) Field of Classification Search
CPC .................................................. H01L 51/5228
USPC .......................................................... 257/40
See application file for complete search history.

(56) References Cited

U.S. PATENT DOCUMENTS

2010/0140649 A1* 6/2010 Kim .................. H01L 51/5206
257/98
2013/0175508 A1* 7/2013 Kwon ................ H01L 27/3211
257/40

FOREIGN PATENT DOCUMENTS

| JP | 2002-318556 A | 10/2002 |
| JP | 4016144 B2 | 9/2007 |
| JP | 2010-108693 A | 5/2010 |
| JP | 2011-040328 A | 2/2011 |
| KR | 10-0501427 B1 | 7/2005 |

\* cited by examiner

*Primary Examiner* — Ajay K Arora
(74) *Attorney, Agent, or Firm* — Lee & Morse, P.C.

(57) ABSTRACT

An organic light emitting diode display includes a substrate, switching elements on the substrate, at least one barrier member on the substrate, a passivation layer covering the switching elements and including a protection opening exposing the barrier member, pixel electrodes on the passivation layer and connected to the switching elements, auxiliary electrodes separated from and formed from a same layer as the pixel electrodes, an organic emission layer including a pixel emission layer and a common emission layer sequentially formed on the pixel electrodes, and a common electrode including an auxiliary common electrode and a main common electrode sequentially formed on the common emission layer. The common emission layer and the auxiliary common electrode have a common contact hole at a position corresponding to a position of the barrier member. The main common electrode is connected with the auxiliary electrode through the common contact hole.

19 Claims, 24 Drawing Sheets

ORGANIC LIGHT EMITTING DIODE DISPLAY AND MANUFACTURING METHOD THEREOF

CROSS-REFERENCE TO RELATED APPLICATION

Korean Patent Application No. 10-2015-0018154, filed on Feb. 5, 2015, in the Korean Intellectual Property Office, and entitled: "Organic Light Emitting Diode Display and Manufacturing Method Thereof," is incorporated by reference herein in its entirety.

BACKGROUND

1. Field

Embodiments relate to an organic light emitting diode display and a manufacturing method thereof.

2. Description of the Related Art

An organic light emitting diode display includes two electrodes of an anode and a cathode, and an organic light emitting layer interposed between the two electrodes. The anode injects holes and the cathode injects electrons into the light emitting layer. The injected electrons and holes are combined to form excitons and the excitons emit light as discharge energy.

Such an organic light emitting diode display includes a plurality of pixels including an organic light emitting diode which is a self-emission device, and in each pixel, a plurality of thin film transistors and storage capacitors for driving the organic light emitting diode are formed.

SUMMARY

Embodiments are directed to an organic light emitting diode display including a substrate, a plurality of switching elements on the substrate, at least one barrier member on the substrate, a passivation layer covering the plurality of switching elements, the passivation layer including a protection opening exposing the barrier member, a plurality of pixel electrodes on the passivation layer, the pixel electrodes being connected to the switching elements, a plurality of auxiliary electrodes separated from and formed from a same layer as the plurality of pixel electrodes, an organic emission layer including a pixel emission layer and a common emission layer sequentially formed on the plurality of pixel electrodes, and a common electrode including an auxiliary common electrode and a main common electrode sequentially formed on the common emission layer. The common emission layer and the auxiliary common electrode have a common contact hole at a position corresponding to a position of the barrier member. The main common electrode may be connected with an auxiliary electrode of the plurality of auxiliary electrodes through the common contact hole.

The substrate may include a plurality of pixel areas and a plurality of pixel edge areas between the plurality of pixel areas. The barrier member, the protection opening, and the auxiliary electrode may be located at a pixel edge area of the plurality of pixel edge areas.

The auxiliary electrode may include a first auxiliary electrode and a second auxiliary electrode separated from each other, the first auxiliary electrode and the second auxiliary electrode including ends that face each other.

The auxiliary electrode may overlap the barrier member.

The barrier member may be positioned between the first auxiliary electrode and the second auxiliary electrode.

The barrier member may be exposed through the protection opening and the common contact hole. The main common electrode is connected with the barrier member.

The organic light emitting diode display may further include a pixel definition layer covering a pixel electrode of the plurality of pixel electrodes and the auxiliary electrode, the pixel definition layer including an auxiliary opening exposing a portion of the auxiliary electrode. The barrier member may be positioned at the auxiliary opening.

The main common electrode may be connected with the auxiliary electrode exposed through the auxiliary opening and the common contact hole.

The auxiliary electrode exposed through the auxiliary opening may be connected with the common emission layer.

The organic light emitting diode display may further include a scan line formed on the substrate and transmitting a scan signal to a switching element of the plurality of switching elements, and a data line crossing the scan line and transmitting a data signal to the switching element. The barrier member may include a first barrier member formed from a same layer as the scan line, and a second barrier member overlapping the first barrier member and formed from a same layer as the data line.

The switching element may include a switching transistor connected to the scan line and the data line, and a driving transistor connected to the switching transistor.

The organic light emitting diode display may further include a third barrier member between the first barrier member and the second barrier member, the third barrier member overlapping the first barrier member and the second barrier member.

Embodiments are also directed to a method for manufacturing an organic light emitting diode display, the method including forming a plurality of switching elements and at least one barrier member on a substrate forming a passivation layer covering a plurality of switching elements the passivation layer including a protection opening exposing the barrier member, forming a plurality of pixel electrodes on the passivation layer, a pixel electrode of the plurality of pixel electrodes being connected to a switching element of the plurality of switching elements, forming a plurality of auxiliary electrodes spaced apart from the plurality of pixel electrodes on the passivation layer, an auxiliary electrode of the plurality of auxiliary electrodes including a first auxiliary electrode and a second auxiliary electrode, forming an organic emission layer sequentially including a pixel emission layer and a common emission layer on the plurality of pixel electrodes, forming an auxiliary common electrode on the common emission layer, forming a common contact hole through the common emission layer and the auxiliary common electrode, the common contact hole exposing a portion of the auxiliary electrode, and forming a main common electrode on the auxiliary common electrode, the main common electrode being connected with the auxiliary electrode through the common contact hole.

The first auxiliary electrode may be formed to be electrically separated from the second auxiliary electrode. Forming the common contact hole may include applying a breakdown voltage between the first auxiliary electrode and the second auxiliary electrode to enable removal of the common emission layer and the auxiliary common electrode on the barrier member.

The first auxiliary electrode and the second auxiliary electrode may be formed to be equipotentially connected. Forming the common contact hole may include applying a breakdown voltage between the auxiliary electrode and the auxiliary common electrode to enable removal the common emission layer and the auxiliary common electrode on the barrier member.

The substrate may include a plurality of pixel areas and a plurality of pixel edge areas formed between a plurality of pixel areas. The barrier member, the protection opening, and the auxiliary electrode may be formed at the pixel edge area.

The barrier member and the auxiliary electrode may be formed to be in an overlapping relationship.

The barrier member may be formed between the first auxiliary electrode and the second auxiliary electrode.

The method may further include forming a pixel definition layer covering the pixel electrode and the auxiliary electrode and having an auxiliary opening exposing a portion of the auxiliary electrode. The barrier member may be positioned at the auxiliary opening.

The main common electrode may be connected with the auxiliary electrode exposed through the auxiliary opening and the common contact hole.

The auxiliary electrode exposed through the auxiliary opening may be connected with the common emission layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
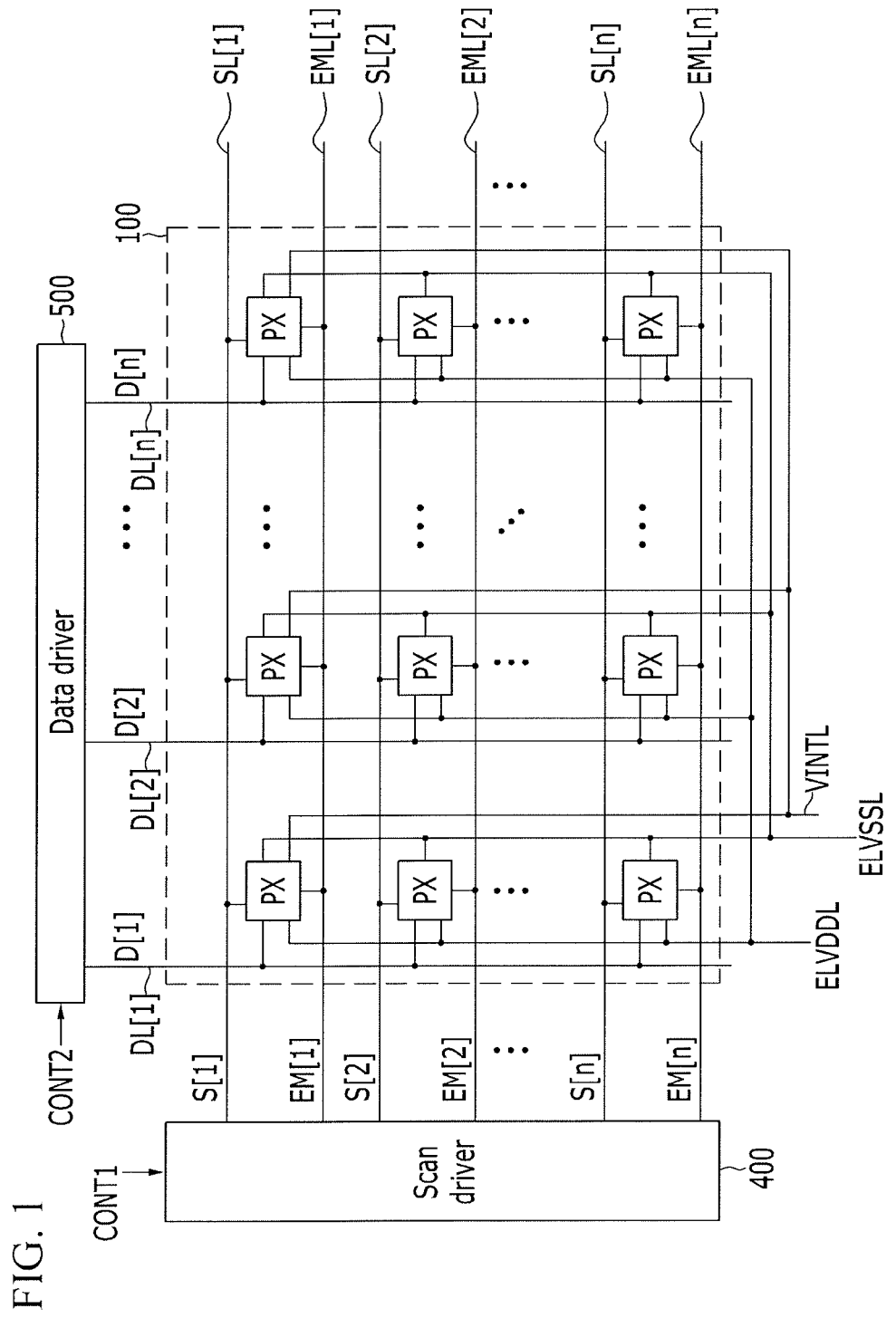
FIG. 1 illustrates an entire circuit diagram of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Further, in the specification, the term "in a plan view" indicates that an object portion is viewed from the above, and the term "in a cross-section" indicates that a cross-section taken by vertically cutting an object portion is viewed from the side.

Also, a number of thin film transistors (TFT) and capacitors are shown in accompanying drawings, and an organic light emitting diode display may include a plurality of transistors and at least one capacitor in one pixel and may be formed to have various structures in which separate wires are further formed or existing wires are omitted. Here, the pixel is a minimum unit for displaying an image, and the organic light emitting diode display displays an image through a plurality of pixels.

FIG. 1 illustrates an entire circuit diagram of an organic light emitting diode display according to an exemplary embodiment.

As shown in FIG. 1, the organic light emitting diode display according to an exemplary embodiment may include a display unit 100 displaying an image and a scan driver 400 and a data driver 500 positioned near the display unit 100. Positions of the scan driver 400 and a data driver 500 may vary. For example, in FIG. 1, the scan driver 400 is shown as being positioned at a left side of the display unit 100 and the data driver 500 is shown as being positioned at an upper side of the display unit 100. In some implementations, the scan driver 400 and the data driver 500 may be positioned at one side of the display unit 100.

The display unit 100 may include a plurality of pixels PX approximately arranged in a matrix. The plurality of pixels PX may be connected to a plurality of signal lines SL[1]-SL[n], EML[1]-EML[n], DL[1]-DL[m], ELVDDL, ELVSSL, and VINTL, the plurality of signal lines including a plurality of scan lines SL[1]-SL[n], a plurality of light emission control lines EML[1]-EML[n], a plurality of data lines DL[1]-DL[m], a driving voltage line ELVDDL transmitting a driving voltage ELVDD, a common voltage line ELVSSL transmitting a common voltage ELVSS, and an initialization voltage line VINTL transmitting an initialization voltage Vint.

The scan driver 400 may be connected to the plurality of scan lines SL[1]-SL[n] and The plurality of light emission control lines EML[1]-EML[n]. The scan driver 400 may generates a plurality of scan signal S[1]-S[n] and a plurality of light emission control signals EM[1]-EM[n] according to a first driving control signal CONT1. The scan driver 400 may respectively transmit a plurality of scan signals S[1]-S[n] to the corresponding scan lines SL[1]-SL[n] and may respectively transmit a plurality of light emission control signals EM[1]-EM[n] to the corresponding light emission control lines EML[1]-EML[n].

The data driver 500 may sample and latch image data R, G, and B according to a second driving control signal CONT2 to generate a plurality of data signals D[1]-D[m]. The data driver 500 may respectively transmit the data signals D[1]-D[m] to the corresponding data line DL[1]-DL[m].

Figure 2:
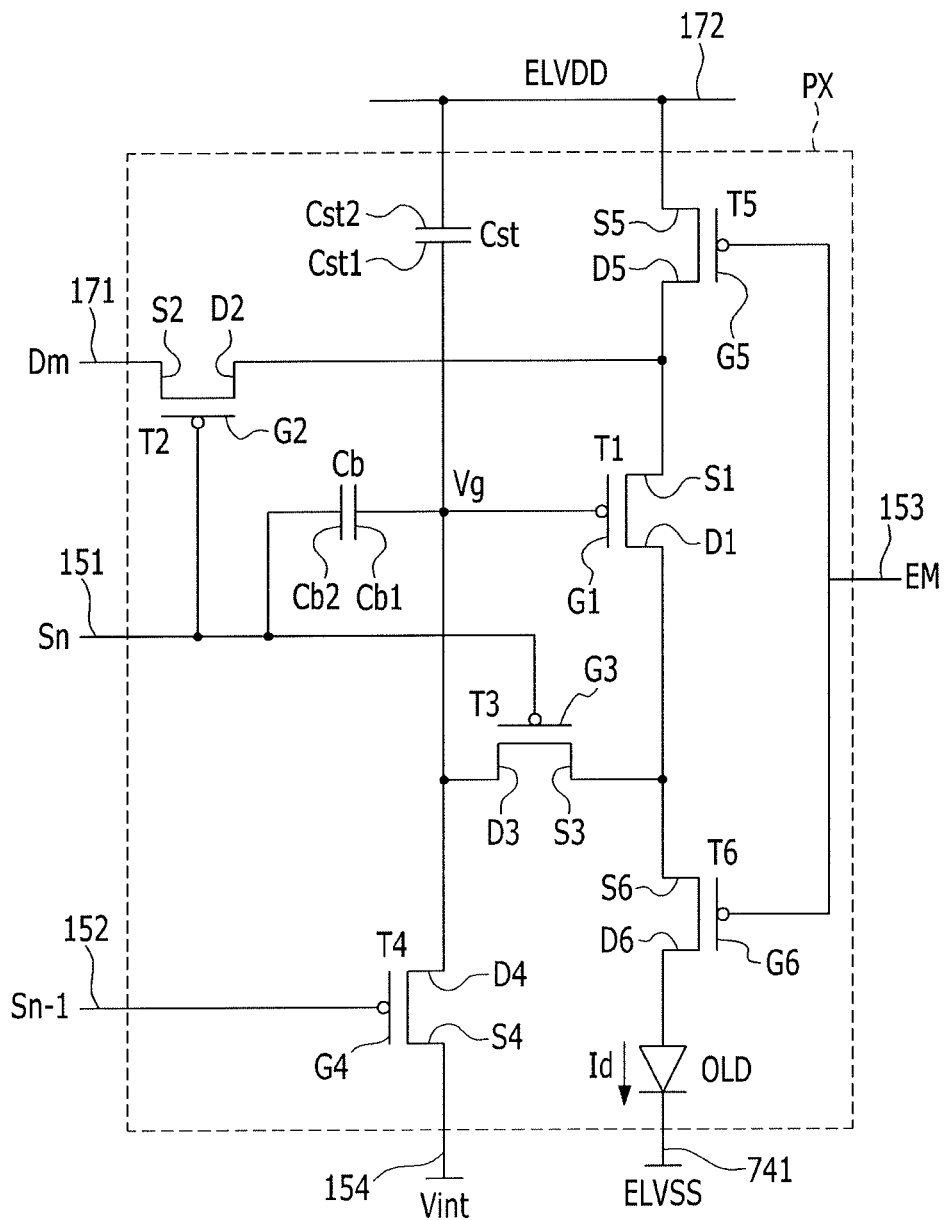
FIG. 2 illustrates an equivalent circuit diagram of one pixel of an organic light emitting diode display according to an exemplary embodiment.

FIG. 2 illustrates an equivalent circuit diagram of one pixel of an organic light emitting diode display according to an exemplary embodiment.

As shown in FIG. 2, one pixel PX of the organic light emitting diode display according to the current exemplary embodiment may include a plurality of transistors T1, T2, T3, T4, T5, and T6 connected to a plurality of signal lines 151, 152, 153, 154. 171, and 172, capacitors Cst and Cb, and an organic light emitting diode OLD. It is to be understood that in other implementation, the number of transistors and capacitors, and the arrangement thereof, may vary from what is shown in FIG. 2.

The signal lines 151, 152, 153, 154 may include a scan line 151, a previous scan line 152, an emission control line 153, and an initialization voltage line 154 respectively applying the scan signal Sn, the previous scan signal Sn−1, the emission control signal EM, and the initialization voltage Vint and formed along the row direction. The signal lines 171 and 172 may include a data line 171 and a driving voltage line 172 crossing the scan line 151, the previous scan line 152, the emission control line 153, and the initialization voltage line 154 and respectively applying the data signal Dm and the driving voltage ELVDD to the pixel PX.

The plurality of transistors T1, T2, T3, T4, T5, and T6 include a driving thin film transistor T1, a switching thin film transistor T2, a compensation transistor T3, an initialization transistor T4, an operation control transistor T5, and a light emission control transistor T6. The capacitors Cst and Cb include a storage capacitor Cst and a boosting capacitor Cb.

A gate electrode G1 of the driving thin film transistor T1 may be connected to one end Cst1 of the storage capacitor Cst. A source electrode S1 of the driving thin film transistor T1 may be connected with the driving voltage line 172 via the operation control thin film transistor T5, and a drain electrode D1 of the driving thin film transistor T1 may be electrically connected with an anode of the organic light emitting diode OLD via the emission control thin film transistor T6. The driving thin film transistor T1 may receive the data signal Dm according to a switching operation of the switching thin film transistor T2 to supply a driving current Id to the organic light emitting diode OLD.

A gate electrode G2 of the switching thin film transistor T2 may be connected with the scan line 151. A source electrode S2 of the switching thin film transistor T2 may be connected with the data line 171, and a drain electrode D2 of the switching thin film transistor T2 may be connected with the source electrode S1 of the driving thin film transistor T1 and with the driving voltage line 172 via the operation control thin film transistor T5. The switching thin film transistor T2 may be turned on according to the scan signal Sn received through the scan line 151 to perform a switching operation for transferring the data signal Dm transferred to the data line 171 to the source electrode S1 of the driving thin film transistor T1.

A gate electrode G3 of the compensation thin film transistor T3 may be directly connected with the scan line 151. A source electrode S3 of the compensation thin film transistor T3 may be connected to the drain electrode D1 of the driving thin film transistor T1 and with an anode of the organic light emitting diode OLD via the emission control thin film transistor T6, and a drain electrode D3 of the compensation thin film transistor T3 may be connected with the drain electrode D4 of the initialization thin film transistor T4, the gate electrode G1 of the driving thin film transistor T1, one end Cst1 of the storage capacitor Cst, and one end Cb1 of the boosting capacitor Cb together. The compensation transistor T3 may be turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 may be connected with the previous scan line 152. A source electrode S4 of the initialization transistor T4 may be connected with an initialization voltage line 154, and a drain electrode D4 of the initialization transistor T4 may be connected with one end Cst1 of the storage capacitor Cst, the gate electrode G1 of the driving transistor T1, and one end Cb1 of the boosting capacitor Cb together through the drain electrode D3 of the compensation transistor T3. The initialization transistor T4 may be turned on according to a previous scan signal Sn−1 received through the previous scan line 152 to transfer the initialization voltage Vint to the gate electrode G1 of the driving transistor T1, and then to perform an initialization operation of initializing a voltage of the gate electrode G1 of the driving transistor T1.

A gate electrode G5 of the operation control transistor T5 may be connected with the light emission control line 153. A source electrode S5 of the operation control transistor T5 may be connected with the driving voltage line 172, and a drain electrode D5 of the operation control transistor T5 may be connected with the source electrode S1 of the driving transistor T1 and the drain electrode S2 of the switching transistor T2.

A gate electrode G6 of the emission control transistor T6 may be connected to the light emission control line 153. The source electrode S6 of the first emission control transistor T6 may be connected to the drain electrode D1 of the driving transistor T1 and the source electrode S3 of the compensation transistor T3, and the drain electrode D6 of the first emission control transistor T6 may be electrically connected to the anode of the organic light emitting diode OLD. The operation control transistor T5 and the first emission control transistor T6 may be simultaneously turned on according to the emission control signal EM transmitted to the light emission control line 153 such that the driving voltage ELVDD may be compensated through the diode-connected driving transistor T1 and may be transmitted to the organic light emitting diode OLD such that the driving current Id may flow to the organic light emitting diode OLD to be emitted, thereby displaying the image.

The scan line 151 connected to the gate electrode G2 of the switching transistor T2 may be connected to the other end Cb2 of the boosting capacitor Cb. One end Cb1 of the boosting capacitor Cb may be connected to the gate electrode G1 of the driving transistor T1.

The other end Cst2 of the storage capacitor Cst may be connected with the driving voltage line 172. A cathode of the organic light emitting diode OLD may be connected with a common voltage line 741 transferring a common voltage ELVSS.

Hereinafter, a detailed operation process of one pixel of the organic light emitting diode display according to the exemplary embodiment will be described in detail.

For an initializing period, the previous scan signal Sn−1 having a low level may be supplied through the previous scan line 152. The initializing thin film transistor T4 may be turned on in response to the previous scan signal Sn−1 having the low level such that the initial voltage Vint is connected to the gate electrode G1 of the driving transistor T1 from the initialization voltage line 154 through the initializing thin film transistor T4, and the driving thin film transistor T1 is initialized by the initialization voltage Vint.

For a data programming period, the scan signal Sn having a low level may be supplied through the scan line 151. The switching thin film transistor T2 and the compensating thin film transistor T3 may be turned on in response to the scan signal Sn having the low level. At this time, the driving transistor T1 may be diode-connected through the turned-on compensation transistor T3 and may be biased in a forward direction.

A compensation voltage Dm+Vth (Vth is a negative (−) value) reduced by a threshold voltage Vth of the driving thin film transistor T1 from a data signal Dm supplied from the data line 171 may be applied to the gate electrode G1 of the driving thin film transistor T1. The gate voltage Vg applied to the gate electrode G1 of the driving transistor T1 may become the compensation voltage (Dm+Vth). The driving voltage ELVDD and the compensation voltage (Dm+Vth) may be applied to both terminals of the storage capacitor Cst, and a charge corresponding to a voltage difference between both terminals may be stored in the storage capacitor Cst.

When the voltage level of the scan signal Sn is changed to a high level while the supply of the scan signal Sn stops, the voltage applied to the gate electrode G1 of the driving thin film transistor T1 may be changed in response to a voltage change width of the scan signal Sn by coupling of the boosting capacitor Cb. In this case, the voltage applied to the gate electrode G1 of the driving thin film transistor T1 may be changed by charge sharing between the storage capacitor Cst and the boosting capacitor Cb. Accordingly, a voltage change amount applied to the driving gate electrode G1 may be changed in proportion to a charge sharing value between the storage capacitor Cst and the boosting capacitor Cb in addition to a voltage change width of the scan signal Sn.

For an emission period, the emission control signal En supplied from the emission control line 123 may be changed from the high level to the low level. The first emission control thin film transistor T5 and the second emission control thin film transistor T6 may be turned on by the emission control signal En of the low level for the emission period.

A driving current Id may be generated according to the voltage difference between the gate voltage of the gate electrode G1 of the driving transistor T1 and the driving voltage ELVDD. The driving current Id may be supplied to the organic light emitting diode OLD through the emission control transistor T6. The gate-source voltage Vgs of the driving thin film transistor T1 may be maintained as "(Dm+Vth)-ELVDD" by the storage capacitor Cst for the emission period, and according to a current-voltage relationship of the driving thin film transistor T1, the driving current Id may be proportional to the square "$(Dm-ELVDD)^2$" of a value obtained by subtracting the threshold voltage from the source-gate voltage. Accordingly, the driving current Id is determined regardless of the threshold voltage Vth of the driving thin film transistor T1.

Next, the detailed structure of the organic light emitting diode display shown in FIG. 1 and FIG. 2 will be described with reference to FIG. 3, FIG. 4, FIG. 5, FIG. 6, FIG. 7, FIG. 8, and FIG. 9 along with FIG. 1.

Figure 3:
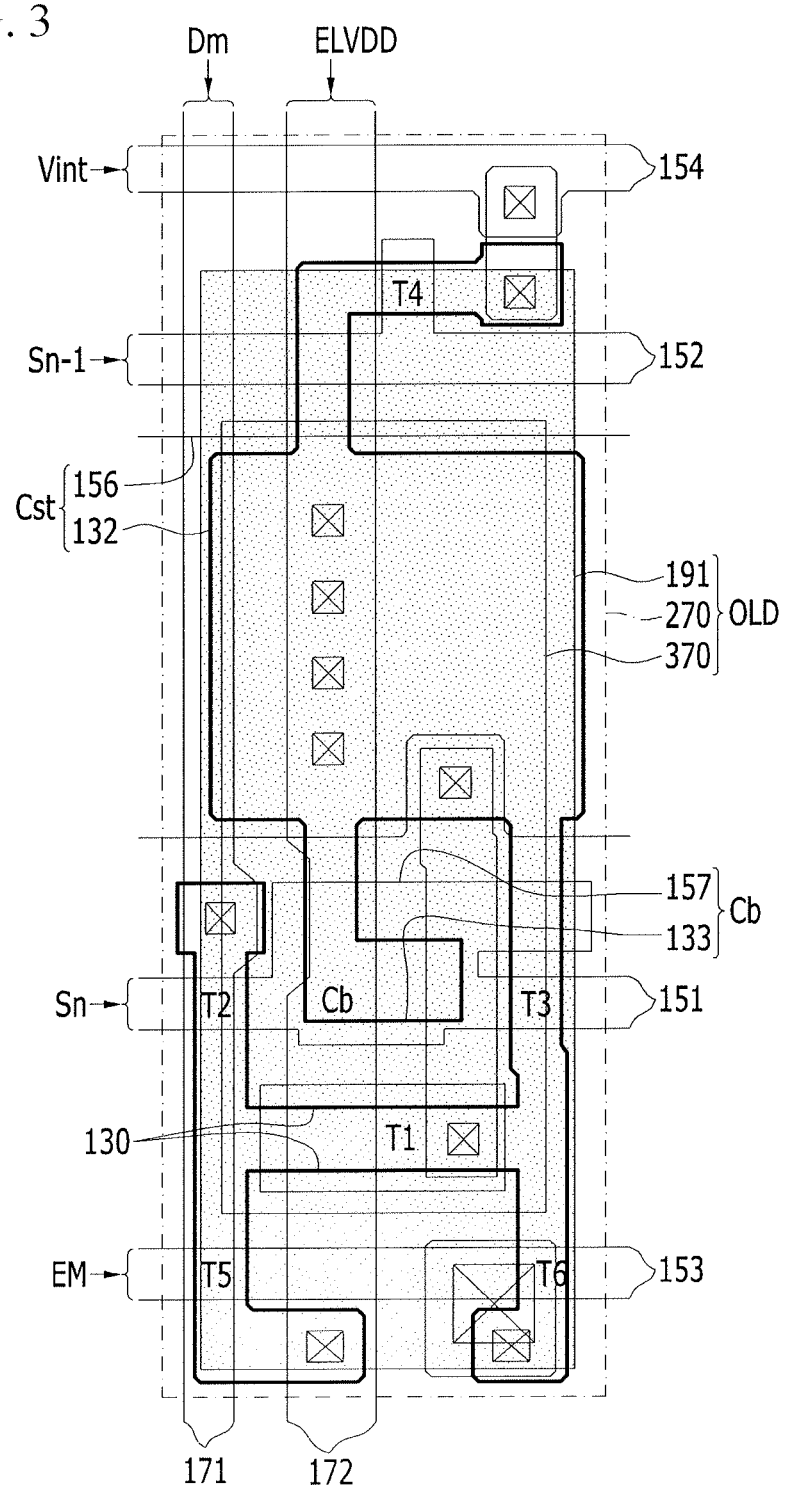
FIG. 3 illustrates a schematic layout view of a plurality of transistors and capacitors of an organic light emitting diode display according to an exemplary embodiment.
Figure 4:
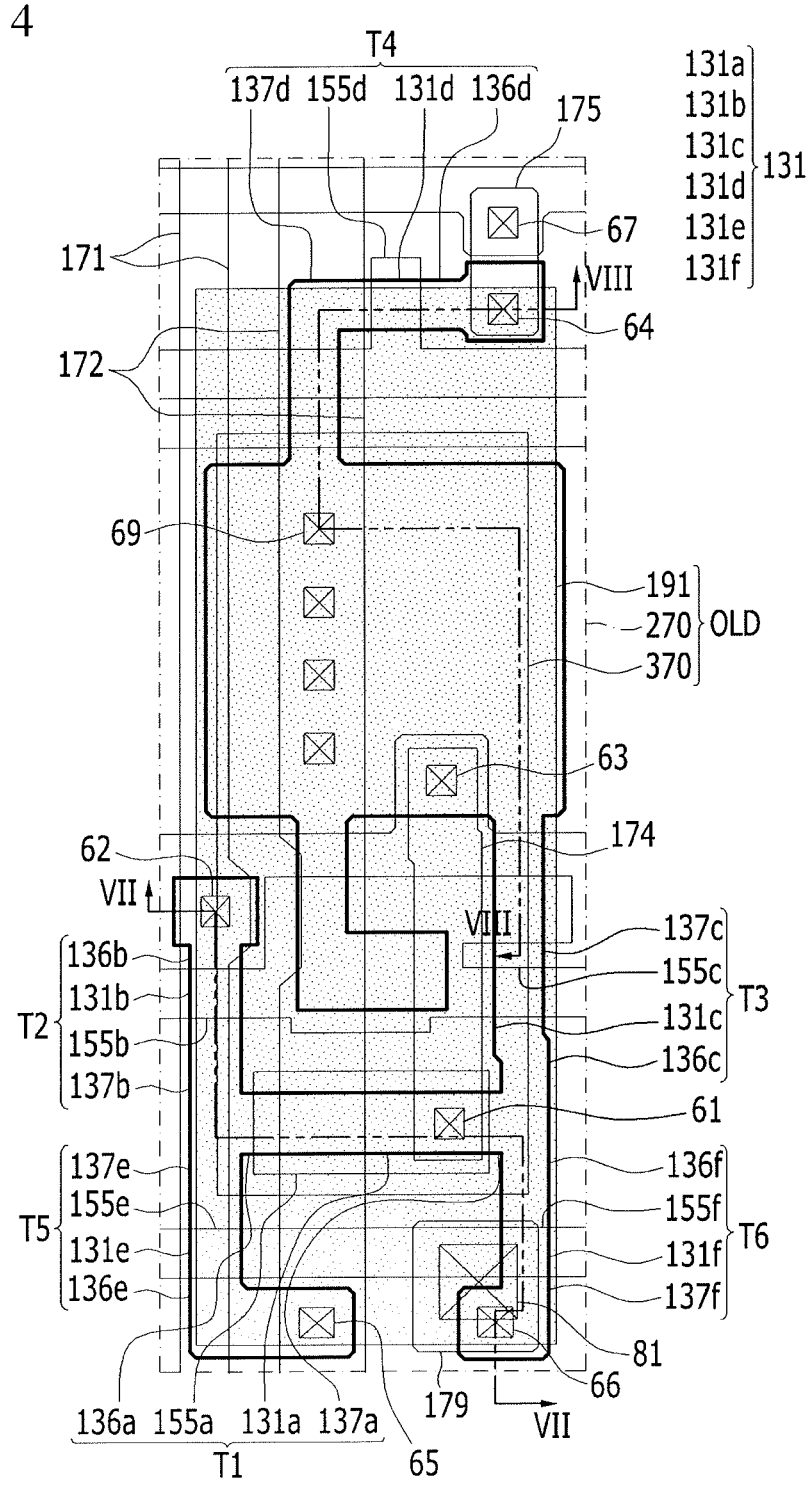
FIG. 4 illustrates a detailed layout view of FIG. 3.
Figure 5:
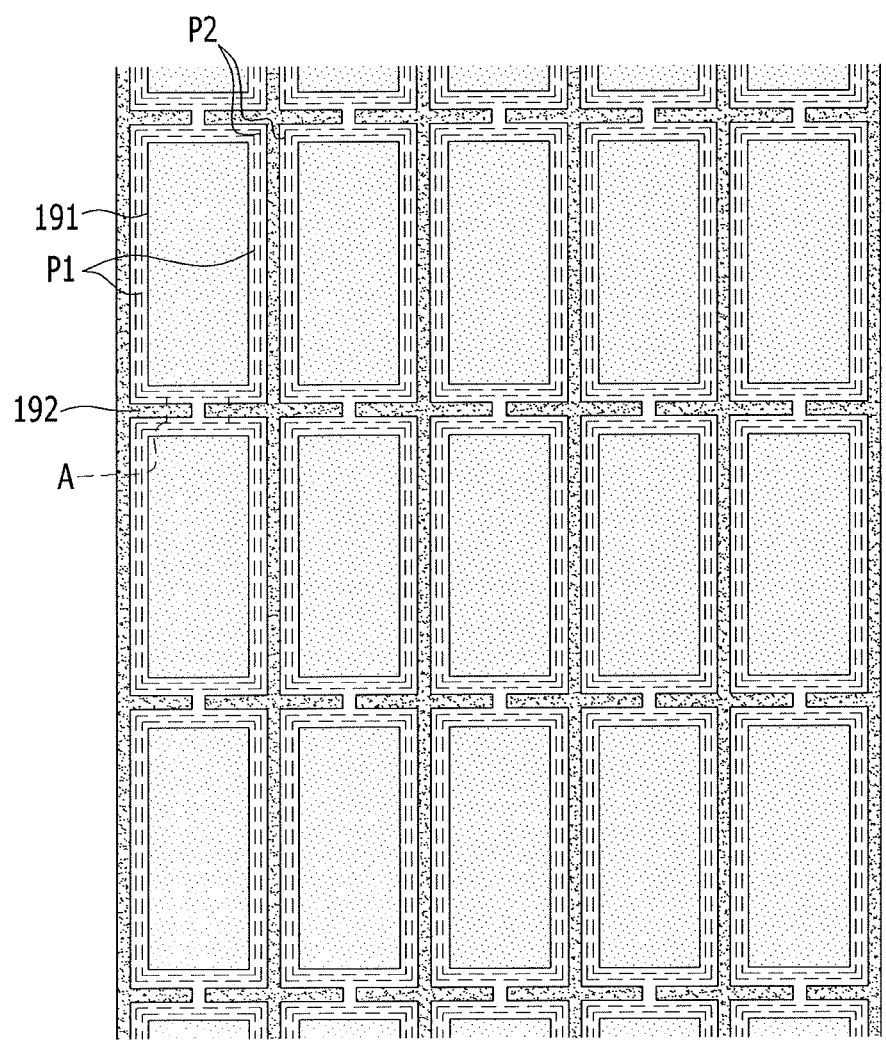
FIG. 5 illustrates a schematic layout view of a plurality of pixel electrodes and an auxiliary electrode of an organic light emitting diode display according to an exemplary embodiment.
Figure 6:
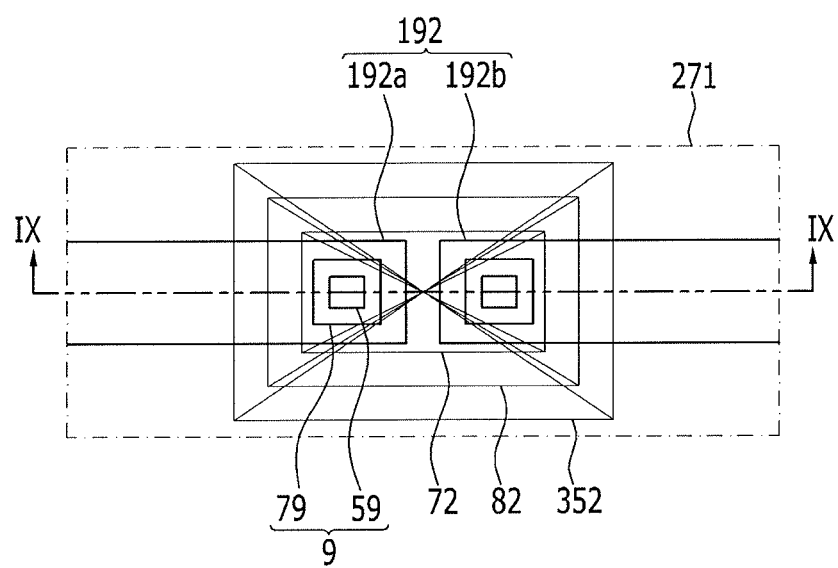
FIG. 6 illustrates a detailed layout view of a portion A of FIG. 5.
Figure 7:
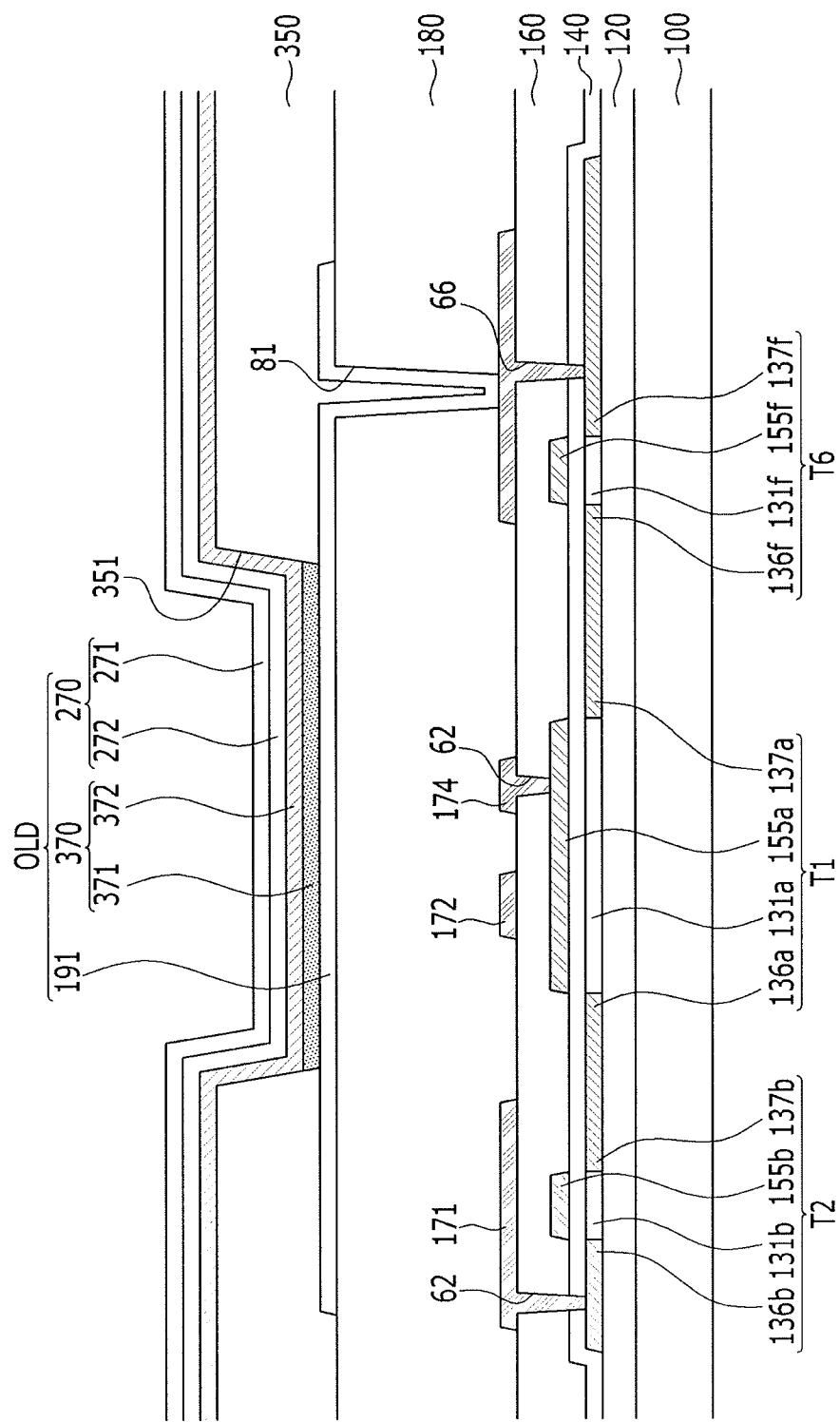
FIG. 7 illustrates a cross-sectional view of the organic light emitting diode display of FIG. 4 taken along a line VII-VII.
Figure 8:
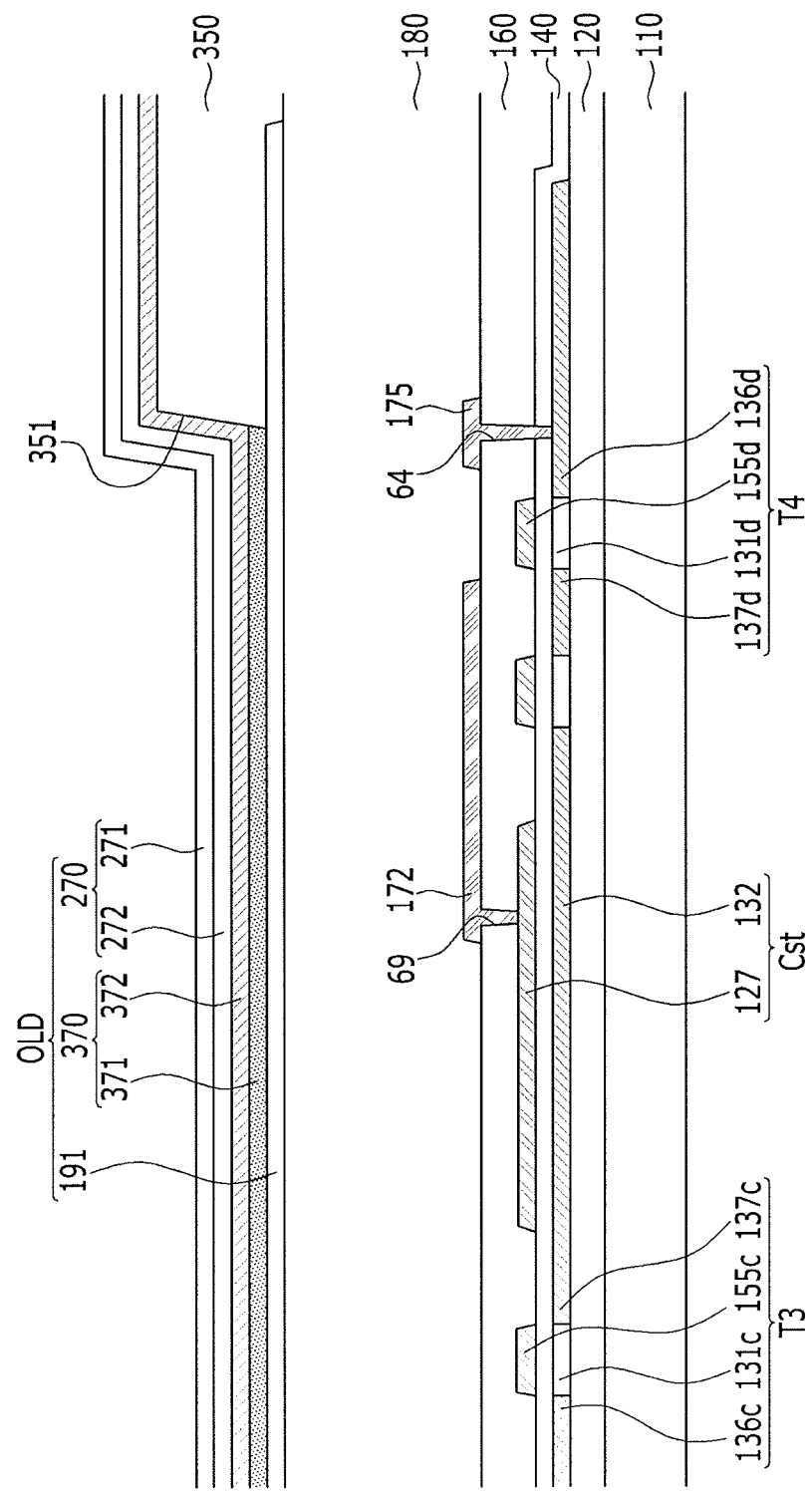
FIG. 8 illustrates a cross-sectional view of the organic light emitting diode display of FIG. 4 taken along a line VIII-VIII.
Figure 9:
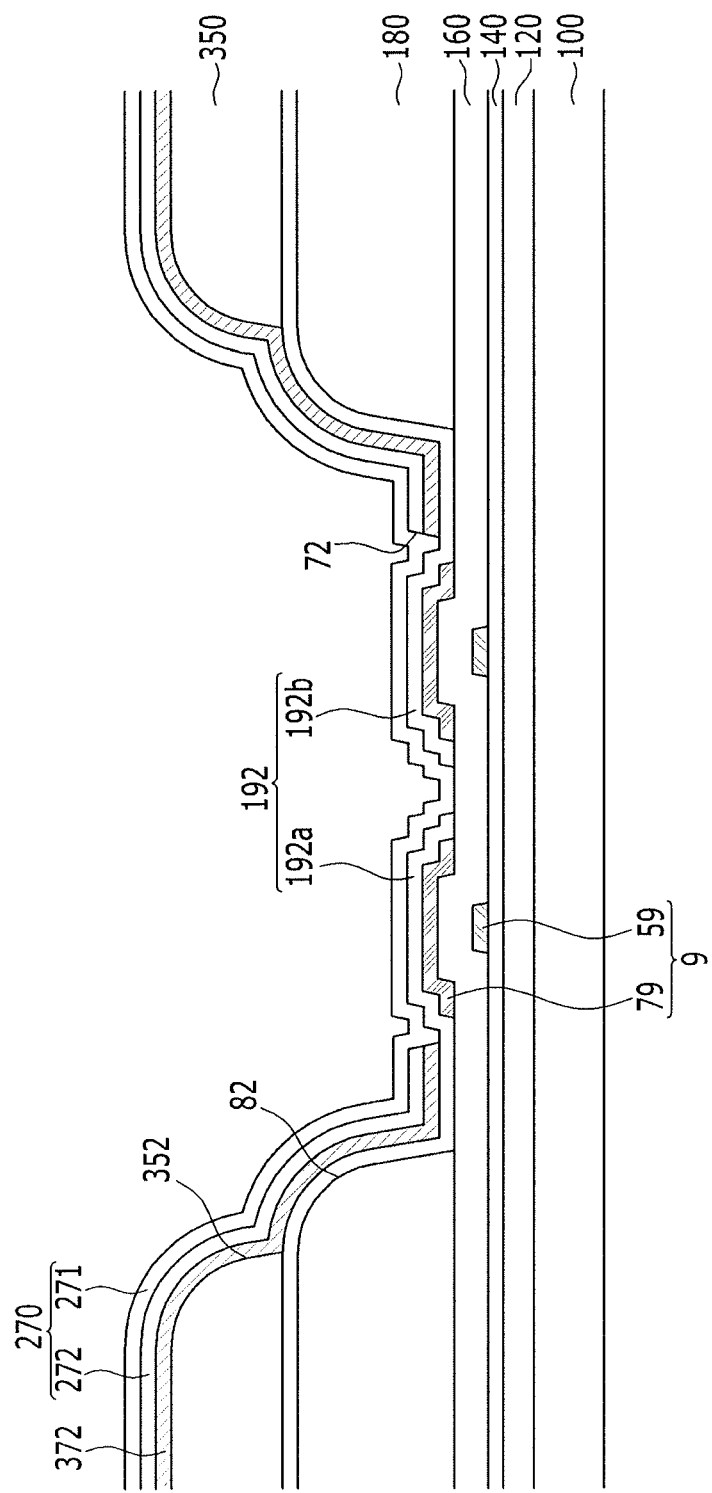
FIG. 9 illustrates a cross-sectional view taken along line IX-IX of FIG. 6.

FIG. 3 illustrates a schematic layout view of a plurality of transistors and capacitors of an organic light emitting diode display according to an exemplary embodiment, FIG. 4 illustrates a detailed layout view of FIG. 3, FIG. 5 illustrates a schematic layout view of a plurality of pixel electrodes and an auxiliary electrode of an organic light emitting diode display according to an exemplary embodiment, FIG. 6 illustrates a detailed layout view of a portion A of FIG. 5, FIG. 7 illustrates a cross-sectional view of the organic light emitting diode display of FIG. 4 taken along a line VII-VII, FIG. 8 illustrates a cross-sectional view of the organic light emitting diode display of FIG. 4 taken along a line VIII-VIII, and FIG. 9 illustrates a cross-sectional view taken along line IX-IX of FIG. 6.

Hereinafter, a detailed planar structure of the organic light emitting diode display according to the exemplary embodiment will be first described in detail with reference to FIG. 3, FIG. 4, FIG. 5, and FIG. 6, and a detailed cross-sectional structure will be described in detail with reference to FIG. 7, FIG. 8, and FIG. 9.

As shown in FIG. 3, the organic light emitting diode display according to an exemplary embodiment may include a scan line 151, a previous scan line 152, a light emission control line 153, and an initialization voltage line 154 connected to the pixel PX, formed in a row direction and respectively applying a scan signal Sn, a previous scan signal Sn−1, a light emission control signal EM, and an initialization voltage Vint, and may include includes a data line 171 and a driving voltage line 172 crossing the scan line 151, the previous scan line 152, the light emission control line 153, and the initialization voltage line 154 and respectively applying a data signal Dm and a driving voltage ELVDD to the pixel PX.

In one pixel PX, a driving transistor T1, a switching transistor T2, a compensation transistor T3, an initialization transistor T4, an operation control transistor T5, a light emission control transistor T6, a storage capacitor Cst, a boosting capacitor Cb, and an organic light emitting diode OLD may be formed. The organic light emitting diode OLD may include a pixel electrode 191, an organic emission layer 370, and a common electrode 270. The compensation transistor T3 and the initialization transistor T4 may be configured as a dual gate structure transistor in order to block a leakage current.

Each channel of the driving transistor T1, the switching transistor T2, the compensation transistor T3, the initialization transistor T4, the operation control transistor T5, and the light emission control transistor T6 may be formed in one semiconductor 130 connected thereto. The semiconductor 130 may be formed to be curved in various shapes. The semiconductor 130 may be made of a polycrystalline semiconductor material or an oxide semiconductor material. The oxide semiconductor material may include an oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which is a compound oxide thereof. In the case where the semiconductor 130 is made of the oxide semiconductor material, a separate passivation layer for protecting the oxide semiconductor material, which may be vulnerable to an external environment such as a high temperature, may be added.

The semiconductor 130 may include a channel 131 that is doped with an N-type impurity or a P-type impurity, and a source doping part and a drain doping part that are formed at respective sides of the channel and doped with an opposite-type doping impurity to the doping impurity doped on the channel. In the exemplary embodiment, the source doping part and the drain doping part may correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors may be doped. Thus, the source electrode and the drain electrode may be electrically connected to each other.

As illustrated in FIG. 4, the channel 131 formed in the semiconductor 130 may include a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, and a light emission control channel 131f formed in the light emission control transistor T6. Also, a first storage electrode 132 and a first boosting electrode 133 may be formed in the semiconductor 130.

The driving transistor T1 may include the driving channel 131a, a driving gate electrode 155a, the driving source electrode 136a, and a driving drain electrode 137a. The driving gate electrode 155a may overlap with the driving channel 131a. The driving source electrode 136a and the driving drain electrode 137a may be formed close by at respective sides of the driving channel 131a. The driving gate electrode 155a may be connected to a driving connecting member 174 through a contact hole 61.

The switching transistor T2 may include the switching channel 131b, a switching gate electrode 155b, a switching source electrode 136b, and a switching drain electrode 137b. The switching gate electrode 155b, which is a part of the scan line 151, may overlap with the switching channel 131b. The switching source electrode 136b and the switching drain electrode 137b may be formed close by at respective sides of the switching channel 131b. The switching source electrode 136b may be connected with the data line 171 through a contact hole 62.

The compensation transistor T3 may include the compensation channel 131c, a compensation gate electrode 155c, a compensation source electrode 136c, and a compensation drain electrode 137c. Two compensation transistors T3 may be formed in order to help prevent the leakage current, and two compensation gate electrodes 155c may be protrusions that extend downwardly from the scan line 151. The compensation gate electrode 155c may overlap the compensation channel 131c. The compensation source electrode 136c and the compensation drain electrode 137c may be respectively formed to be adjacent to both sides of the compensation channel 131c. The compensation drain electrode 137c may be connected to the driving connecting member 174 through a contact hole 63.

The initialization transistor T4 may include the initialization channel 131d, an initialization gate electrode 155d, an initialization source electrode 136d, and an initialization drain electrode 137d. Two initialization transistors T4 may be formed in order to help prevent the leakage current, and two initialization gate electrodes 155d may be protrusions that extend downwardly from the previous scan line 152. The initialization gate electrode 155d may overlap the initialization channel 131d. The initialization source electrode 136d and the initialization drain electrode 137d may be respectively formed to be adjacent to both sides of the initialization channel 131d. The initialization source electrode 136d may be connected to an initialization connecting member 175 through a contact hole 64, and the initialization drain electrode 137d may be connected to the driving connecting member 174 through the contact hole 63.

The operation control transistor T5 may include the operation control channel 131e, an operation control gate electrode 155e, an operation control source electrode 136e, and an operation control drain electrode 137e. The operation control gate electrode 155e may be a protrusion that extends upwardly from the light emission control line 153. The operation control gate electrode 155c may overlap with the operation control channel 131e. The operation control source electrode 136e and the operation control drain electrode 137e may be formed close by at respective sides of the operation control channel 131e. The operation control source electrode 136e may be connected with a part of the driving voltage line 172 through a contact hole 65.

The light emission control transistor T6 may include the light emission control channel 131f, a light emission control gate electrode 155f, a light emission control source electrode 136f, and a light emission control drain electrode 137f. The light emission control gate electrode 155f may be a protrusion that extends upwardly from the light emission control line 153 and overlaps with the light emission control channel 131f. The emission control source electrode 136f and the emission control drain electrode 137f may be formed close by at respective sides of the emission control channel 131f.

The light emission control drain electrode 137f may be connected with an emission control connecting member 179 through a contact hole 66.

The driving source electrode 136a may be connected to the switching drain electrode 137b and the operation control drain electrode 137e, and the driving drain electrode 137a may be connected to the compensation source electrode 136c and the light emission control source electrode 136f.

The storage capacitor Cst may include a first storage electrode 132 and a second storage electrode 156 disposed with a gate insulating layer 140 interposed therebetween. The gate insulating layer 140 may function as a dielectric material, and a storage capacitance may be determined by a charge charged to the storage capacitor Cst and a voltage between both electrodes 132 and 156.

The first storage electrode 132 may be formed with the same layer as the channel 131, and the second storage electrode 156 may be formed with the same layer as the scan line 151, the previous scan line 152, and the light emission control line 153. The first storage electrode 132 may include a doping impurity.

The first storage electrode 132 may be formed between the compensation drain electrode 177c and the initialization drain electrode 177d, and may be connected to the driving gate electrode 155a through the first boosting electrode 133 and the driving connecting member 174. The second storage electrode 156 may be connected to the driving voltage line 172 through a contact hole 69.

The storage capacitor Cst may store a storage capacitance corresponding to a difference between the driving voltage ELVDD transferred to the second storage electrode 156 through the driving voltage line 172 and the gate voltage Vg of the driving gate electrode 155a.

The first boosting electrode 133 of the boosting capacitor Cb may be an extension that extends from the first storage electrode 132. A second boosting electrode 157 may be a protrusion that extends upwardly from the scan line 151. The boosting capacitor Cb may perform a boosting operation increasing the gate voltage Vg of the driving gate electrode 155a according to the change of the scan signal Sn of the scan line 151 to improve the driving range, thereby providing an accurate degree of grayness.

The driving connecting member 174 may be formed with the same layer as the data line 171. One end of the driving connecting member 174 may be connected to the driving gate electrode 155a through the contact hole 61. The other end of the driving connecting member 174 may be connected to the compensation drain electrode 137c of the compensation transistor T3 through the contact hole 63. Accordingly, the driving connecting member 174 may connect the driving gate electrode 155a and the compensation drain electrode 137c of the compensation transistor T3 to each other.

The initialization connecting member 175 may have a quadrangle shape and may be connected to the initialization voltage line 154 through a contact hole 67. A light emission control connecting member 179 having a quadrangle shape may be connected to the pixel electrode 191 of the organic light emitting diode OLD through a contact hole 81. In an exemplary embodiment shown in FIG. 3 and FIG. 4, the initialization voltage line may have a straight line shape parallel to the scan line, and the pixel electrode may have an approximate quadrangle shape covering most of the pixel. In other implementations, the shape of the pixel electrode, the initialization voltage line, the initialization connecting member, and the light emission control connecting member may be variously changed.

An organic emission layer 370 may be formed on the pixel electrode 191. The organic emission layer 370 may include a pixel emission layer 371 and a common emission layer 372. The pixel emission layer 371 may be formed only in a pixel of a corresponding color. However, the common emission layer 372 may be commonly formed in all pixels. For example, the common emission layer 372 as an emission layer of blue may be formed on the red pixel and the green pixel as well as on the blue pixel. A common electrode 270 may be formed on the organic emission layer 370. The common electrode 270 may include an auxiliary common electrode 272 and a main common electrode 271 that are sequentially deposited.

As shown in FIG. 5, a plurality of pixel electrodes 191 may be disposed approximately in a matrix in the pixel area P1, and the auxiliary electrode 192 may be formed with a mesh structure at the pixel edge area P2 between the pixel electrodes 191. The auxiliary electrode 192 may be connected with the common electrode 270 to reduce resistance of the common electrode 270, thereby helping to prevent a voltage drop of the common electrode 270.

A structure of the common contact portion A positioned at the pixel edge area P2 and connecting the auxiliary electrode 192 and the common electrode 270 to each other will be described in detail with reference to FIG. 6.

As shown in FIG. 6, the auxiliary electrode 192 may be divided into a first auxiliary electrode 192a and a second auxiliary electrode 192b. A barrier member 9 may be formed at a position corresponding to an end of the auxiliary electrode 192. The barrier member 9 may include a first barrier member 59 and a second barrier member 79. The end of the auxiliary electrode 192 may be positioned to be higher than other portions of the auxiliary electrode 192 by being formed on the barrier member 9.

The auxiliary common electrode 272 and the common emission layer 372 together have a common contact hole 72 that exposes the auxiliary electrode 192. The main common electrode 271 may be connected with the auxiliary electrode 192 through the common contact hole 72 and an auxiliary opening 352.

Hereinafter, the cross-sectional structure of the organic light emitting diode display device according to an exemplary embodiment will be described in detail according to a stacking order with reference FIG. 7, FIG. 8, and FIG. 9.

In this case, the stacked structures of the operation control transistor T5 may be mostly the same as that of the light emission control transistor T6. Accordingly, a detailed description the same features will not be repeated.

A buffer layer 120 may be formed on a substrate 110. The substrate 110 may be an insulating substrate formed of an insulating material such as glass, crystal, ceramic, or plastic. The buffer layer 120 may block impurities from the insulating substrate 110 during a crystallization process for forming a polycrystalline semiconductor and may serve to improve characteristics of the polycrystalline semiconductor and reduce stress applied to the insulating substrate 110. The buffer layer 120 may be formed of a silicon nitride (SiNx) or a silicon oxide (SiOx).

A semiconductor 130, including a driving channel 131a, a switching channel 131b, a compensation channel 131c, an initialization channel 131d, an operation control channel 131e, a light emission control channel 131f, a first storage electrode 132, and a first boosting electrode 133, may be formed on the buffer layer 120 of the pixel area P1. A driving source electrode 136a and a driving drain electrode 137a may be formed on respective sides of the driving channel 131a in the semiconductor 130, and a switching source electrode 136*b* and a switching drain electrode 137*b* may be formed on respective sides of the switching channel 131*b*. The compensation source electrode 136*c* and the compensation drain electrode 137*c* may be formed at both sides of the compensation channel 131*c*, and the initialization source electrode 136*d* and the initialization drain electrode 137*d* may be formed at both sides of the initialization channel 131*d*. The operation control source electrode 136*e* and the operation control drain electrode 137*e* may be formed at both sides of the operation control channel 131*e*, and the light emission control source electrode 136*f* and the light emission control drain electrode 137*f* may be formed at both sides of the light emission control channel 131*f*. The first storage electrode 132 and the first boosting electrode 133 may be formed between the compensation drain electrode 137*c* and the initialization drain electrode 137*d*.

A gate insulating layer 140 covering the semiconductor 130 may be formed thereon. The gate insulating layer 140 may be formed of a silicon nitride (SiNx) or a silicon oxide (SiOx).

A scan line 151, including a switching gate electrode 155*b* and a compensation gate electrode 155*c*, a previous scan line 152, an initialization gate electrode 155*d*, a light emission control line 153 including an operation control gate electrode 155*e* and a light emission control gate electrode 155*f*, a driving gate electrode 155*a*, a second storage electrode 156, and a second boosting electrode 157 may be formed on the gate insulating layer 140. A pair of first barrier members 59 may be formed on the gate insulating layer 140 positioned in the pixel edge area P2.

The gate wires 151, 152, 153, 155*a*, 156, 157, and 59 may be formed as a multilayer in which a metal layer including one of copper (Cu), a copper alloy, aluminum (Al), an aluminum alloy, molybdenum (Mo), and a molybdenum alloy is deposited.

An interlayer insulating layer 160 covering the gate insulating layer 140 and the gate wires 151, 152, 153, 155*a*, 156, 157, and 59 may be formed thereon. The interlayer insulating layer 160 may be formed of a silicon nitride (SiNx) or a silicon oxide (SiOx).

A data line 171, a driving voltage line 172, a driving connecting member 174, and initialization connecting member 175, and a light emission control connecting member 179 may be formed on the interlayer insulating layer 160.

A pair of second barrier members 79 may be formed on the interlayer insulating layer 160 positioned in the pixel edge area P2. The second barrier members 79 may overlap the first barrier member 59. The second barrier members 79 may cover all of the first barrier member 59. The first barrier member 59 and the second barrier member 79 may together form the barrier member 9.

The data wires 171, 172, 174, 175, 179, and the second barrier members 79 may be formed of a multilayer in which a metal layer including one of copper (Cu), a copper alloy, aluminum (Al), an aluminum alloy, molybdenum (Mo), and a molybdenum alloy is deposited, and may be formed of a triple layer of, for example, titanium/aluminum/titanium (Ti/Al/Ti), molybdenum/aluminum/molybdenum (Mo/Al/Mo), or molybdenum/copper/molybdenum (Mo/Cu/Mo).

The data line 171 may be connected to the switching source electrode 136*b* through the contact hole 62 formed while having the same boundary line in the gate insulating layer 140 and the interlayer insulating layer 160. One end of the driving connecting member 174 may be connected to the driving gate electrode 155*a* through the contact hole 61 formed in the interlayer insulating layer 160, and the other end of the driving connecting member 174 may be connected to the compensation drain electrode 137*c* through the contact hole 63 formed while having the same boundary line in the gate insulating layer 140 and the interlayer insulating layer 160.

One end of the initialization connecting member 175 may be connected to the initialization source electrode 136*d* through the contact hole 64 formed in the gate insulating layer 140 and the interlayer insulating layer 160. The other end of the initialization connecting member 175 may be connected to the initialization voltage line 154 through the contact hole 67 formed in the interlayer insulating layer 160. The light emission control connecting member 179 may be connected to the light emission control drain electrode 137*f* through the contact hole 66 formed in the gate insulating layer 140 and the interlayer insulating layer 160.

A passivation layer 180 covering the data wires 171, 172, 174, and 179, the second barrier members 79, and the interlayer insulating layer 160 may be formed thereon. The passivation layer 180 may cover the data wires 171, 172, 174, and 179 for planarization such that the pixel electrode 191 may be formed on the passivation layer 180 without a step.

The passivation layer 180 positioned at the pixel edge area P2 may include a protection opening 82 exposing the barrier member 9.

The passivation layer 180 may be formed of an organic material such as a polyacryl-based resin or a polyimide-based resin, or may be a deposition layer of the organic material and an inorganic material.

A pixel electrode 191 and an auxiliary electrode 192 are formed on the passivation layer 180. The light emission control connecting member 179 may be connected to the pixel electrode 191 through the contact hole 81 formed on the passivation layer 180. The auxiliary electrode 192 may be divided into a first auxiliary electrode 192*a* and a second auxiliary electrode 192*b*. The ends of the first auxiliary electrode 192*a* and the second auxiliary electrode 192*b* may be positioned respectively corresponding to a pair of barrier members 9. The ends of the first auxiliary electrode 192*a* and the second auxiliary electrode 192*b* may be directly connected with a pair of barrier members 9 exposed through the protection opening 82.

A pixel definition layer PDL 350 may be formed on the passivation layer 180, the auxiliary electrode 192, and the edge of the pixel electrode 191, and the pixel definition layer 350 may include a pixel opening 351 that exposes the pixel electrode 191 and an auxiliary opening 352 that exposes the end of the auxiliary electrode 192. The barrier member 9 may be positioned at the auxiliary opening 352 of the pixel definition layer 350. By maximally expanding the auxiliary opening 352, the step of the common emission layer 372, the auxiliary common electrode 272, and the main common electrode 271 formed on the pixel definition layer 350 may be minimized such that the contact between the main common electrode and the auxiliary electrode 192 may be facilitated.

The pixel definition layer 350 may be made of the organic material such as a polyacrylate resin and a polyimide resin, or a silica-series inorganic material.

An organic emission layer 370 may be formed on the pixel electrode 191 exposed on the pixel opening 351, and the organic emission layer 370 may include a pixel emission layer 371 formed in the pixel area P1 and a common emission layer 372 formed to the pixel edge area P2. A common electrode 270 may be formed on the organic emission layer 370. The common electrode 270 may include an auxiliary common electrode 272 in the pixel area P1 and the portion of the pixel edge area P2, and a main common electrode 271 formed over the entire surface including the pixel area P1 and the pixel edge area P2.

The common emission layer 372 and the auxiliary common electrode 272 together may have a common contact hole 72 exposing the end of the auxiliary electrode 192. The main common electrode 271 may be directly connected with the auxiliary electrode 192 exposed through the common contact hole 72 and the auxiliary opening 352. Accordingly, the resistance of the common electrode 270 may be reduced, thereby helping to prevent a voltage drop of the common electrode 270.

An organic light emitting diode OLD is formed to include includes the pixel electrode 191, the organic emission layer 370, and the common electrode 270. The pixel electrode 191 may be an anode, which is a hole injection electrode, and the common electrode 270 may be a cathode, which is an electron injection electrode. In other implementations, the pixel electrode 191 may be the cathode, and the common electrode 270 may be the anode according to a driving method of the organic light emitting diode display. When holes and electrons are injected into the organic emission layer 370 from the pixel electrode 191 and the common electrode 270, respectively, and excitons acquired by combining the injected holes and electrons fall from an excitation state to a ground state, light is emitted.

The pixel emission layer 371 and the common emission layer 372 may be made of a low-molecular organic material or a high-molecular organic material such as poly(3,4-ethylenedioxythiophene) (PEDOT). The organic emission layer 370 may be formed with multiple layers including at least one of an emission layer, a hole injection layer (HIL), a hole transporting layer (HTL), an electron transporting layer (ETL), and an electron injection layer (EIL). When the organic emission layer 370 includes all of the layers, the hole injection layer may be disposed on the pixel electrode 191 which is the positive electrode, and the hole transporting layer, the emission layer, the electron transporting layer, and the electron injection layer may be sequentially laminated thereon.

The pixel emission layer 371 may include a red organic emission layer emitting red light and a green organic emission layer emitting green light. The common emission layer 372 may include a blue organic emission layer emitting blue light. The red organic emission layer and the blue organic emission layer may be formed together in the red pixel, the green organic emission layer and the blue organic emission layer may be formed together in the green pixel, and the blue organic emission layer may be formed in the blue pixel, thereby realizing a color image.

An encapsulation member protecting the organic light emitting diode OLD may be formed on the common electrode 270. The encapsulation member may be sealed to the substrate 110 by a sealant and may be formed of various materials such as glass, quartz, ceramic, plastic, or a metal. In some implementations, a thin film encapsulation layer may be formed on the common electrode 270 by depositing an inorganic layer and an organic layer with the usage of a sealant.

A manufacturing method of the organic light emitting diode display according to an exemplary embodiment will be described with reference to accompanying drawings.

Figure 10:
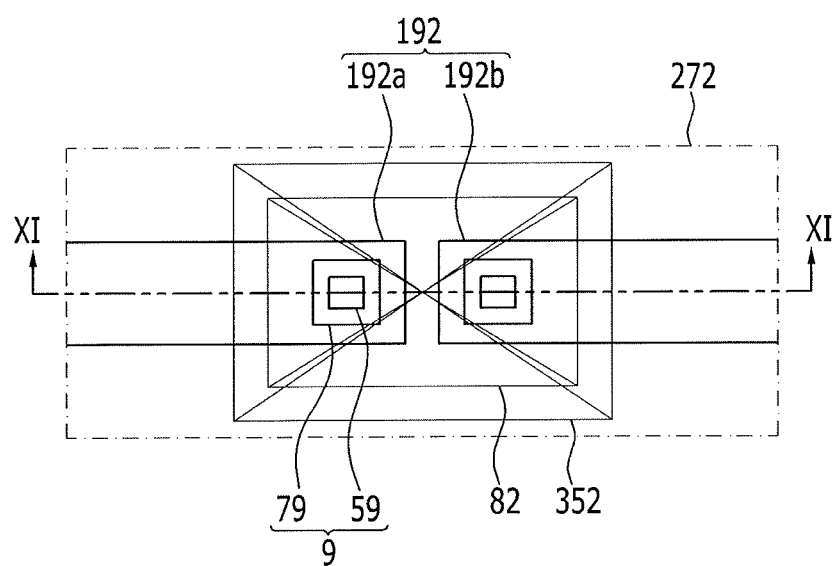
FIG. 10 and FIG. 12 illustrate layout views sequentially showing a manufacturing method of an organic light emitting diode display according to an exemplary embodiment.
Figure 11:
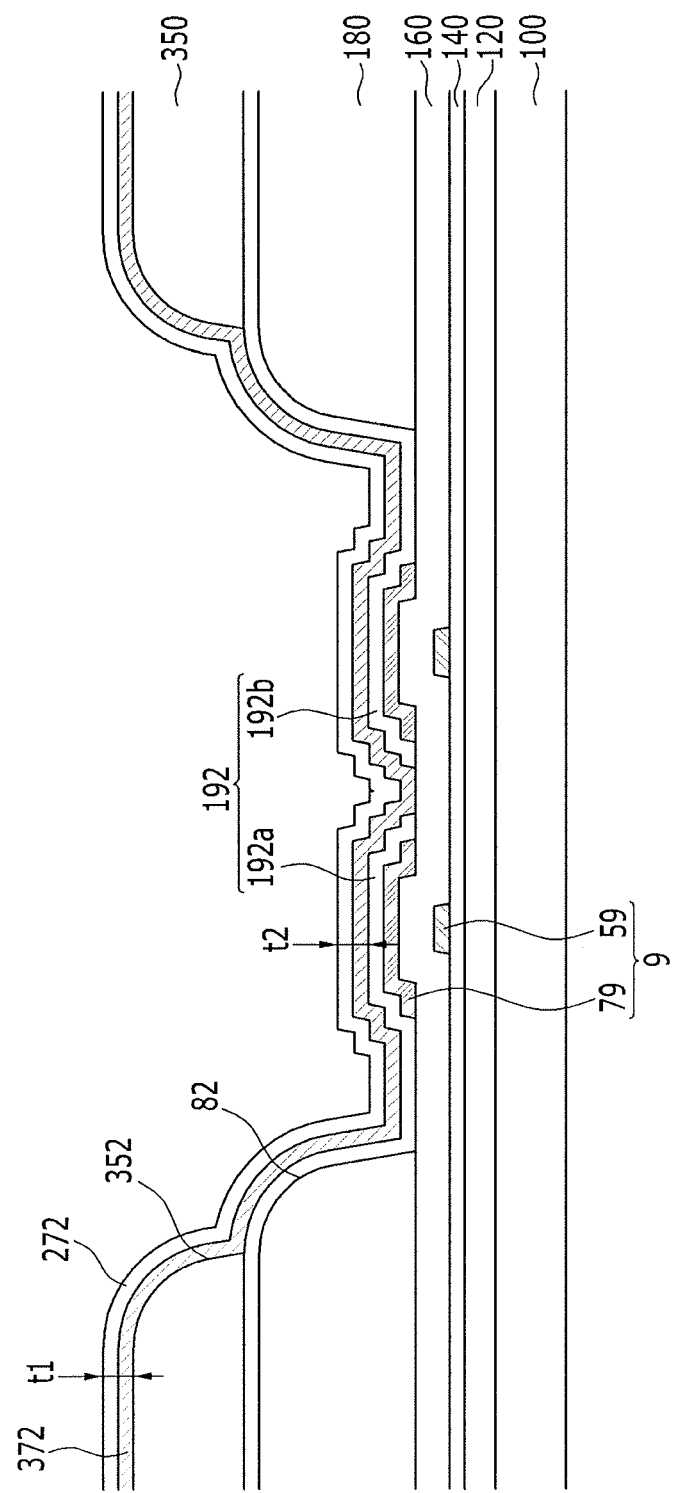
FIG. 11 illustrates a cross-sectional view taken along a line XI-XI of FIG. 10.
Figure 12:
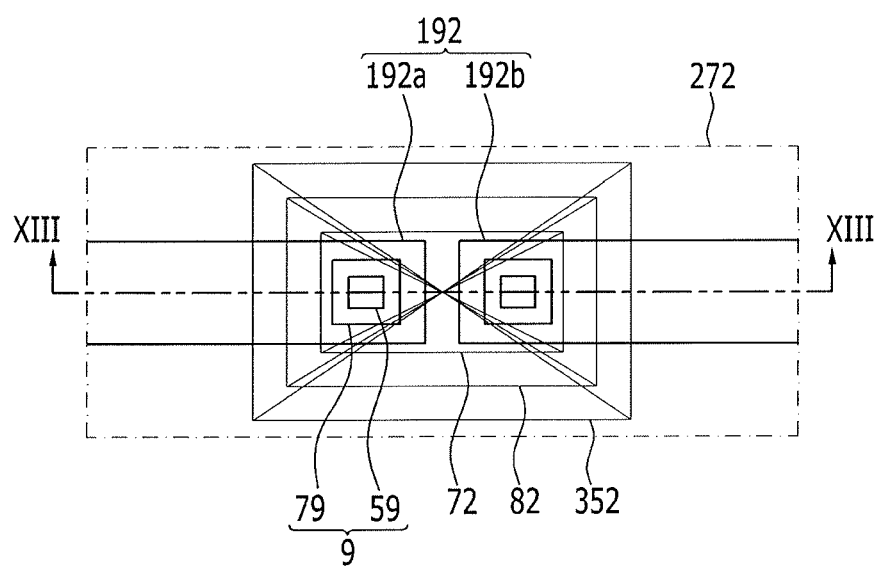
Figure 13:
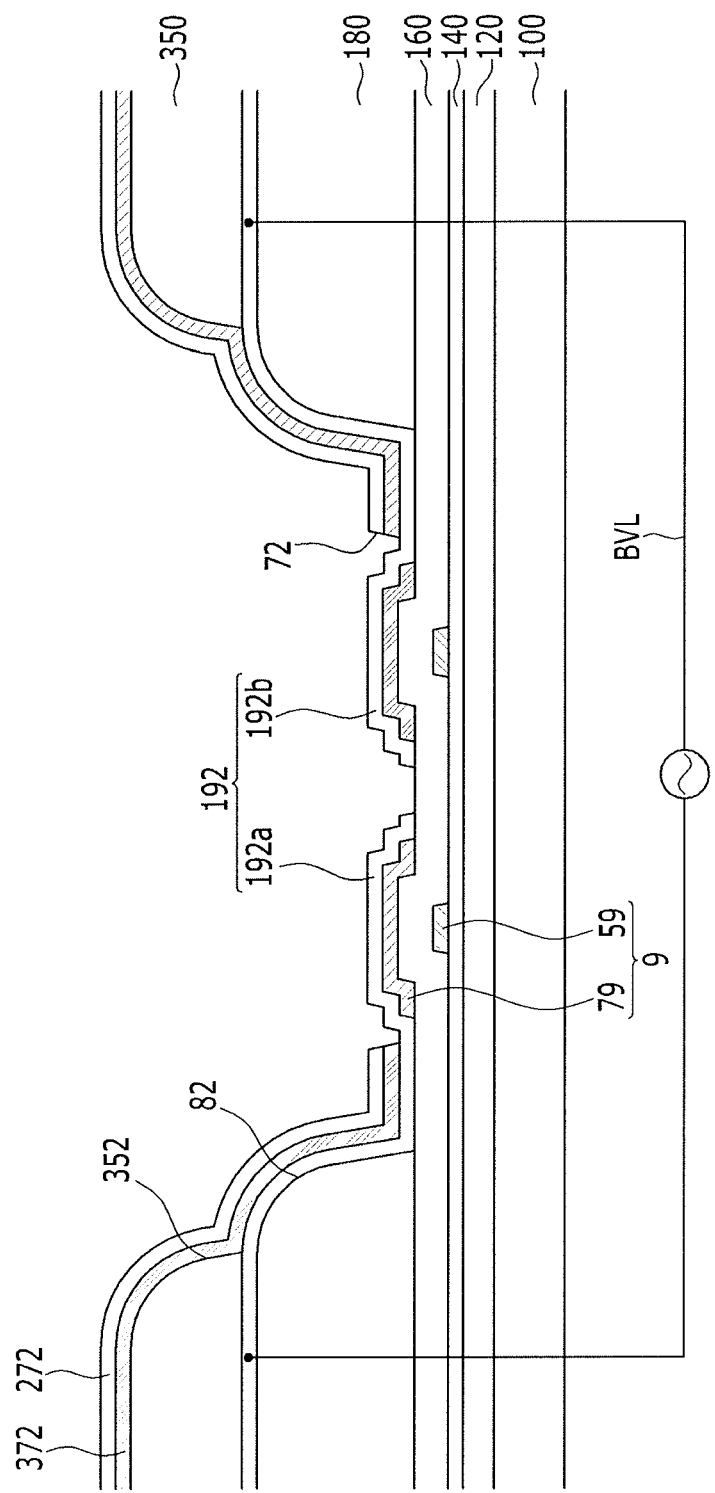
FIG. 13 illustrates a cross-sectional view taken along a line XIII-XIII of FIG. 12.

FIG. 10 and FIG. 12 illustrate layout views sequentially showing a manufacturing method of an organic light emitting diode display according to an exemplary embodiment, FIG. 11 illustrates a cross-sectional view taken along a line XI-XI of FIG. 10, and FIG. 13 illustrates a cross-sectional view taken along a line XIII-XIII of FIG. 12.

As shown in FIG. 7, FIG. 8, FIG. 10, and FIG. 11, the buffer layer 120 may be formed on the substrate 110. The buffer layer 120 may be formed of a single layer of a silicon nitride or a laminate layer of a silicon nitride and a silicon oxide, and may be deposited on an entire surface of the substrate 110 by a method such as plasma enhanced chemical vapor deposition (PECVD). The semiconductor layer may be formed on the buffer layer 120. The semiconductor layer may be formed of polysilicon or an oxide semiconductor. The polysilicon may be formed by a method of forming an amorphous silicon layer and then crystallizing the layer. Various suitable methods may be applied as the crystallizing method. For example, the amorphous silicon layer may be crystallized by using heat, a laser, Joule heat, an electric field, a catalyst metal, or the like. The semiconductor layer may be an intrinsic semiconductor that is not doped with the impurity. On the polycrystalline semiconductor layer, a photolithography process may be performed by using a first mask, and the polycrystalline semiconductor layer may be patterned as the semiconductor 130. The semiconductor 130 is not doped at this time, and as a result, the semiconductor 130 is not yet divided into the semiconductor, the source electrode, and the drain electrode configuring each transistor. Channel doping having a low doping concentration may be performed on the semiconductor 130 to make the semiconductor 130 into an impurity semiconductor.

Further, a gate insulating layer 140 covering the buffer layer 120 and the semiconductor 130 may be formed thereon. The gate insulating layer 140 may be formed of a silicon nitride (SiNx), a silicon oxide (SiOx), or the like, and may be deposited on an entire surface by a method such as plasma enhanced chemical vapor deposition (PECVD). A gate metal layer may be deposited on the gate insulating layer 140. The gate metal layer may be patterned by the photolithography process using a second mask. As a result, in the pixel area P1, a scan line 151, a previous scan line 152, a light emission control line 153, a driving gate electrode 155a, a second storage electrode 156, and a second boosting electrode 157 may be formed. In the pixel edge area P2, a pair of first barrier members 59 may be formed. The gate metal layer may be formed of a multilayer in which a metal layer including any one of copper (Cu), a copper alloy, aluminum (Al), and an aluminum alloy, and a metal layer including any one of molybdenum (Mo) and a molybdenum alloy, are laminated.

Next, source and drain doping having a higher doping concentration than a channel doping is processed to the semiconductor 130. The semiconductor 130 may be source and drain doped in the exposed region, for example, a portion not covered by the switching gate electrode 155b, the compensation gate electrode 155c, the initialization gate electrode 155d, the operation control gate electrode 155e, the light emission control gate electrode 155f, and the driving gate electrode 155a. As a result, a source electrode and a drain electrode of each transistor may be formed, and a first storage electrode 132 and a first boosting electrode 133 may be formed. A channel 131 of each transistor may be formed in the region that is not doped, or that is only lightly doped, in the semiconductor 130. That is, the driving channel 131a, the switching channel 131b, the compensation channel 131c, the initialization channel 131d, the operation control channel 131e, and the light emission control channel 131f may be simultaneously formed. As described above, a separate mask may be omitted when source and drain doping the semiconductor 130.

Next, an interlayer insulating layer 160 covering the gate insulating layer 140, the scan line 151, the previous scan line 152, the light emission control line 153, the driving gate electrode 155a, the second storage electrode 156, the second boosting electrode 157, and a pair of first barrier members 59 may be formed. The interlayer insulating layer 160 may be formed of a silicon nitride (SiNx), a silicon oxide (SiOx), or the like, and may be deposited on an entire surface by a method such as plasma enhanced chemical vapor deposition (PECVD). A dopant activation process may be performed to place the impurity doped in the semiconductor 130 and to remove any damage at the boundary between the semiconductor 130 and the gate insulating layer 140.

The gate insulating layer 140 and the interlayer insulating layer 160 may be patterned to form a plurality of contact holes 61, 62, 63, 64, 65, 66, 67, and 69 by the photolithography process using a third mask.

Next, a data metal layer may be formed on the interlayer insulating layer 160. The data metal layer may be formed as a multilayer where a metal layer including any one of copper, a copper alloy, aluminum, and an aluminum alloy, and a metal layer including any one of molybdenum and a molybdenum alloy, are laminated. For example, the data metal layer may be formed of a triple layer of titanium/aluminum/titanium (Ti/Al/Ti), or a triple layer of molybdenum/aluminum/molybdenum (Mo/Al/Mo) or molybdenum/copper/molybdenum (Mo/Cu/Mo). The data metal layer may be patterned by a photolithography process using a fourth mask. Accordingly, a data line 171, a driving voltage line 172, a driving connecting member 174, an initialization connecting member 175, and a light emission control connecting member 179 may be formed on the interlayer insulating layer 160 of the pixel area P1, and a pair of second barrier members 79 may be formed on the interlayer insulating layer 160 of the pixel edge area P2.

A passivation layer 180 may be formed on the interlayer insulating layer 160 and may be patterned by a photolithography process using a fifth mask to form a contact hole 81 in the passivation layer 180 positioned in the pixel area P1 and to form a protection opening 82 exposing a barrier member 9 in the passivation layer 180 positioned in the pixel edge area P2.

A pixel electrode layer may be formed on the passivation layer 180 and may be patterned by a photolithography process using a sixth mask. Accordingly, a pixel electrode 191 connected to the light emission control connecting member 179 through the contact hole 81 may be formed on the passivation layer 180 of the pixel area P1. An auxiliary electrode 192 contacting the barrier member 9 through the protection opening 82 of the pixel edge area P2 may be formed.

A pixel definition layer 350 covering the pixel electrode 191 and the auxiliary electrode 192 may be formed on the passivation layer 180. A pixel opening 351 exposing a portion of the pixel electrode 191 may be formed in the pixel definition layer 350 positioned at the pixel area P1 by using a seventh mask. An auxiliary opening 352 exposing the end of the auxiliary electrode 192 may be formed in the pixel definition layer 350 positioned at the pixel edge area P2.

A pixel emission layer 371 may be formed on the pixel electrode 191 exposed through the pixel opening 351 of the pixel definition layer 350, and a common emission layer 372 may be formed on the pixel emission layer 371 and the pixel definition layer 350. An auxiliary common electrode 272 may be formed on the common emission layer 372. The common emission layer 372 and the auxiliary common electrode 272 positioned on the barrier member 9 may be formed to be higher than other portions of the common emission layer 372 and the auxiliary common electrode 272, and a thickness t2 of the common emission layer 372 and the auxiliary common electrode 272 positioned on the barrier member 9 may be formed to be thinner than the thickness t1 of the other portions.

As shown in FIG. 12 and FIG. 13, a breakdown voltage line BVL may be connected between the first auxiliary electrode 192a and the second auxiliary electrode 192b that are electrically separated to apply a breakdown voltage. The breakdown voltage may be retained between the first auxiliary electrode 192a and the auxiliary common electrode 272, and the breakdown voltage may also also retained between the second auxiliary electrode 192b and the auxiliary common electrode 272. When the thickness t2 of the common emission layer 372 and the auxiliary common electrode 272 positioned on a pair of barrier members 9 is thinner than the thickness t1 of the other portion, the common emission layer 372 and the auxiliary common electrode 272 may be easily removed by the discharge due to the breakdown voltage, thereby forming a common contact hole 72. The end of the auxiliary electrode 192 may be exposed through the common contact hole 72. By forming the auxiliary electrode 192, the common emission layer 372 and the auxiliary common electrode 272 at a position to overlap the barrier member 9, the common emission layer 372 and the auxiliary common electrode 272 formed with the thin thickness may be easily removed by the discharge due to the breakdown voltage.

As shown in FIG. 6 and FIG. 9, a main common electrode 271 may be formed on the auxiliary common electrode 272. The main common electrode 271 may be directly connected with the auxiliary electrode 192 exposed through the common contact hole 72 and the auxiliary opening 352 such that the resistance of the common electrode 270 may be reduced, thereby helping to prevent the voltage drop of the common electrode 270. The main common electrode 271 may be formed throughout the entire region including the position corresponding to the pixel definition layer 350 such that use of a separate mask may be omitted.

In the manufacturing method according to the exemplary embodiment, the first auxiliary electrode 192a and the second auxiliary electrode 192b may be electrically separated from each other such that the breakdown voltage is applied therebetween. In other implementations of the manufacturing method, the first auxiliary electrode 192a and the second auxiliary electrode 192b may be connected to each other in an equipotential state from the outside, and the breakdown voltage may be applied between the auxiliary common electrode 272 and the auxiliary electrode 192.

Figure 14:
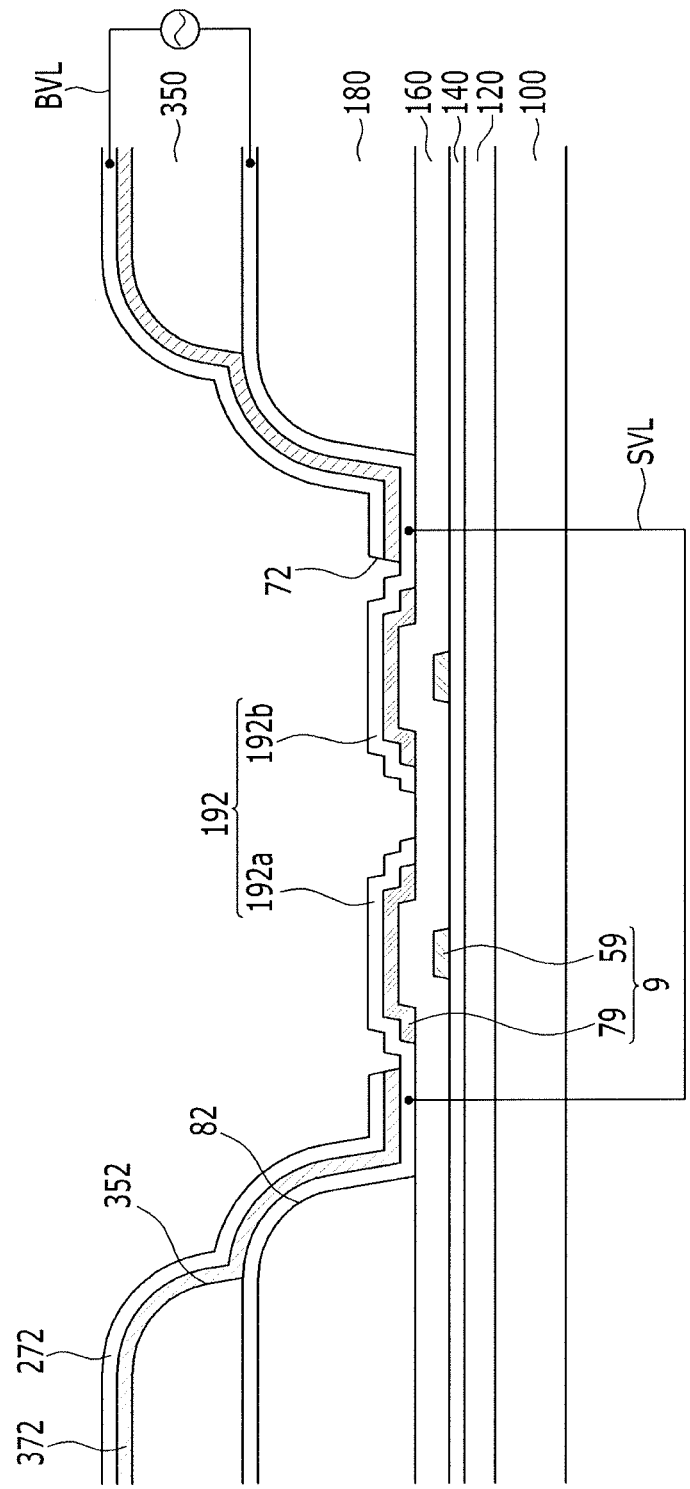
FIG. 14 illustrates a cross-sectional view of a manufacturing method of an organic light emitting diode display according to another exemplary embodiment taken along a line XIII-XIII of FIG. 12.

FIG. 14 illustrates a cross-sectional view, taken along a line XIII-XIII of FIG. 12, of a manufacturing method of an organic light emitting diode display according to another exemplary embodiment.

The manufacturing method shown in FIG. 14 may be substantially the same as the manufacturing method according to an exemplary embodiment shown in FIG. 13, except that the first auxiliary electrode 192a and the second auxiliary electrode 192b are connected to each other in an equipotential state from the outside.

As shown in FIG. 8 and FIG. 14, in the current manufacturing method of the organic light emitting diode display according to an exemplary embodiment, the pixel emission layer 371 may be formed on the pixel electrode 191 exposed through the pixel opening 351 of the pixel definition layer 350, and a common emission layer 372 may be formed on the pixel emission layer 371 and the pixel definition layer 350. An auxiliary common electrode 272 may be formed on the common emission layer 372. As shown in FIG. 14, the first auxiliary electrode 192a and the second auxiliary electrode 192b may be connected to each other in an equipotential state by using an equipotential line SVL. The breakdown voltage may be applied by connecting a breakdown voltage line BVL between the auxiliary electrode 192 and the auxiliary common electrode 272. In this case, when the thickness t2 of the common emission layer 372 and the auxiliary common electrode 272 positioned on a pair of barrier members 9 is thinner than the thickness t1 of other portions of the common emission layer 372 and the auxiliary common electrode 272, the common emission layer 372 and the auxiliary common electrode 272 positioned on the pair of barrier members 9 may be easily removed by the discharge due to the breakdown voltage such that the common contact hole 72 is formed. Accordingly, the ends of the auxiliary electrode 192 may be exposed through the common contact hole 72. As described above, by forming the barrier member 9 at the position overlapping the auxiliary electrode 192, the common emission layer 372 and the auxiliary common electrode 272 formed on the auxiliary electrode 192 may be formed with a thin thickness such that the common emission layer 372 and the auxiliary common electrode 272 may be easily removed by the discharge due to the breakdown voltage.

As shown in FIG. 6 and FIG. 9, the main common electrode 271 may be formed on the auxiliary common electrode 272. The main common electrode 271 may be directly connected with the auxiliary electrode 192 exposed through the common contact hole 72 and the auxiliary opening 352 such that the resistance of the common electrode 270 may be reduced, thereby helping to prevent the voltage drop of the common electrode 270.

In an exemplary embodiment, the barrier member may overlap the auxiliary electrode. In other implementations, the barrier member may be positioned between the first auxiliary electrode and the second auxiliary electrode.

Figure 15:
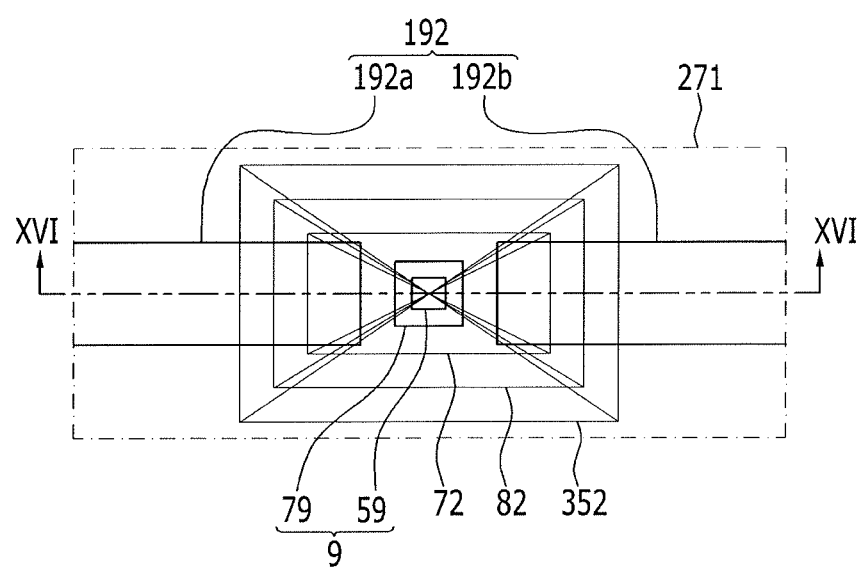
FIG. 15 illustrates a detailed layout view of an organic light emitting diode display according to another exemplary embodiment corresponding to a portion A of FIG. 5.
Figure 16:
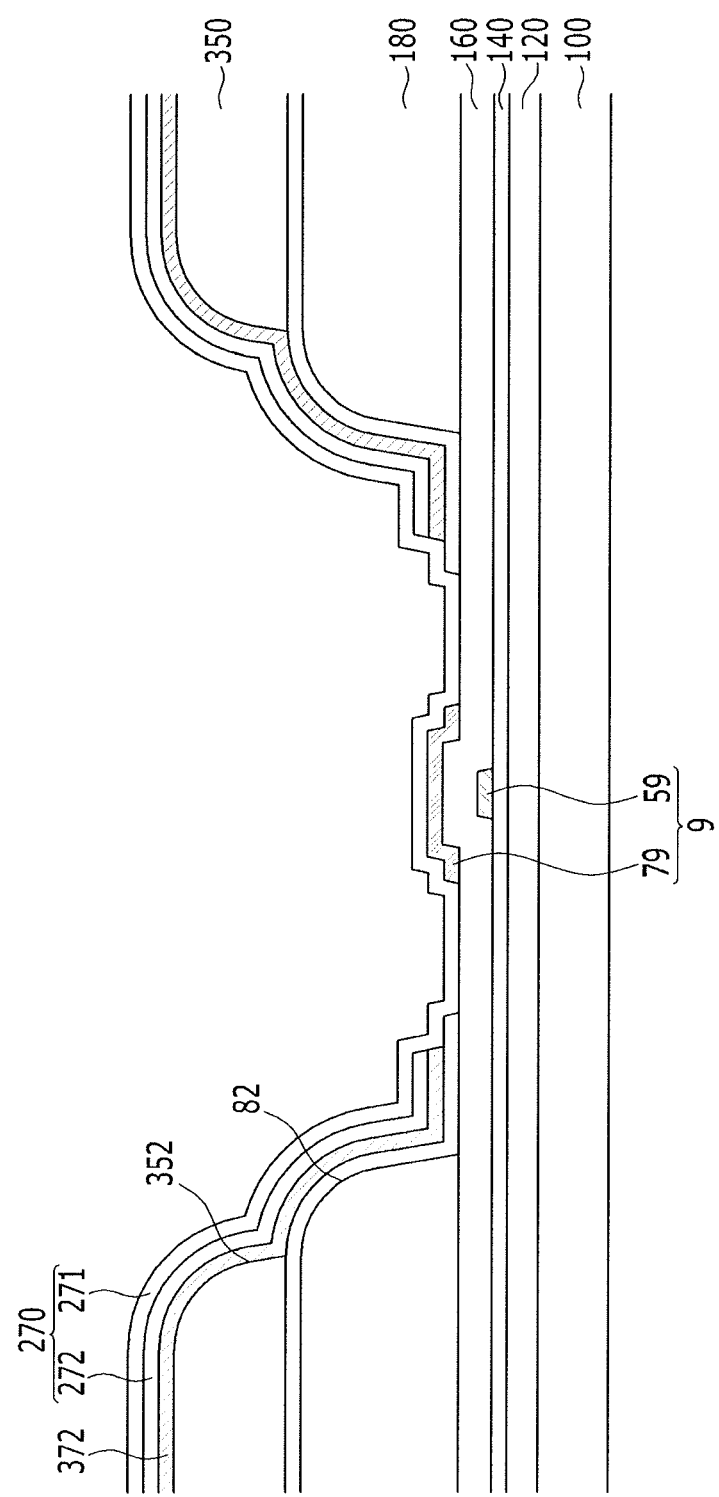
FIG. 16 illustrates a cross-sectional view taken along a line XVI-XVI of FIG. 15.

FIG. 15 illustrates a detailed layout view of an organic light emitting diode display according to another exemplary embodiment corresponding to a portion A of FIG. 5, and FIG. 16 illustrates a cross-sectional view taken along a line XVI-XVI of FIG. 15.

The exemplary embodiment shown in FIG. 15 and FIG. 16 is substantially the same as the exemplary embodiment shown in FIG. 1 to FIG. 11 except that the barrier member is positioned between the first auxiliary electrode and the second auxiliary electrode.

As shown in FIG. 15 and FIG. 16, in the organic light emitting diode display according to the current exemplary embodiment, the buffer layer 120 may be formed on the substrate 110 positioned at the pixel edge area P2, and the gate insulating layer 140 is formed on the buffer layer 120. A first barrier member 59 may be formed on the gate insulating layer 140, and an interlayer insulating layer 160 may be formed on the first barrier member 59 and the gate insulating layer 140. A second barrier member 79 may be formed at the position overlapping the first barrier member 59 on the interlayer insulating layer 160. The first barrier member 59 and the second barrier member 79 form a barrier member 9 together. A passivation layer 180 may be formed on the interlayer insulating layer 160. The passivation layer 180 positioned at the pixel edge area P2 may have a protection opening 82 exposing the barrier member 9. An auxiliary electrode 192 may be formed on the passivation layer 180. The auxiliary electrode 192 may be separated into a first auxiliary electrode 192a and a second auxiliary electrode 192b. The barrier member 9 may be positioned between the first auxiliary electrode 192a and the second auxiliary electrode 192b. A pixel definition layer 350 covering the auxiliary electrode 192 positioned on the pixel edge area P2 is formed thereon. The pixel definition layer 350 may include an auxiliary opening 352 exposing the end of the auxiliary electrode 192 and the barrier member 9.

A common electrode 270 may be formed on the common emission layer 372 formed to the pixel edge area P2. The common electrode 270 may include an auxiliary common electrode 272 formed in the pixel area P1 and the portion of the pixel edge area P2, and a main common electrode 271 formed on the entire surface including the pixel area P1 and the pixel edge area P2.

The common emission layer 372 and the auxiliary common electrode 272 may have a common contact hole 72 exposing the end of the auxiliary electrode 192 together. When the main common electrode 271 is directly connected with the auxiliary electrode 192 exposed by the common contact hole 72 and the auxiliary opening 352, the resistance of the common electrode 270 may be reduced, thereby helping to prevent a voltage drop of the common electrode 270.

A manufacturing method of the organic light emitting diode display according to another exemplary embodiment will be described with reference to accompanying drawings.

Figure 17:
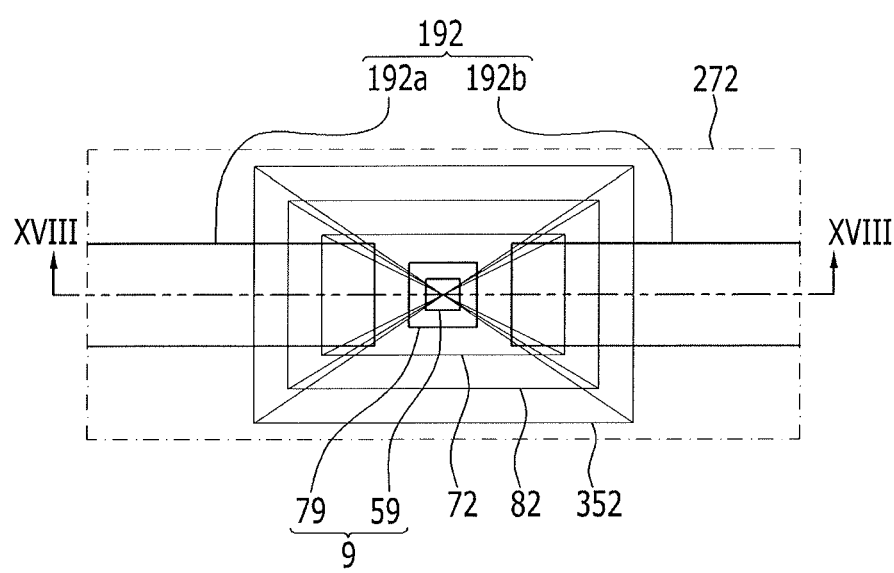
FIG. 17 illustrates a layout view showing one step of a manufacturing method of an organic light emitting diode display according to another exemplary embodiment.
Figure 18:
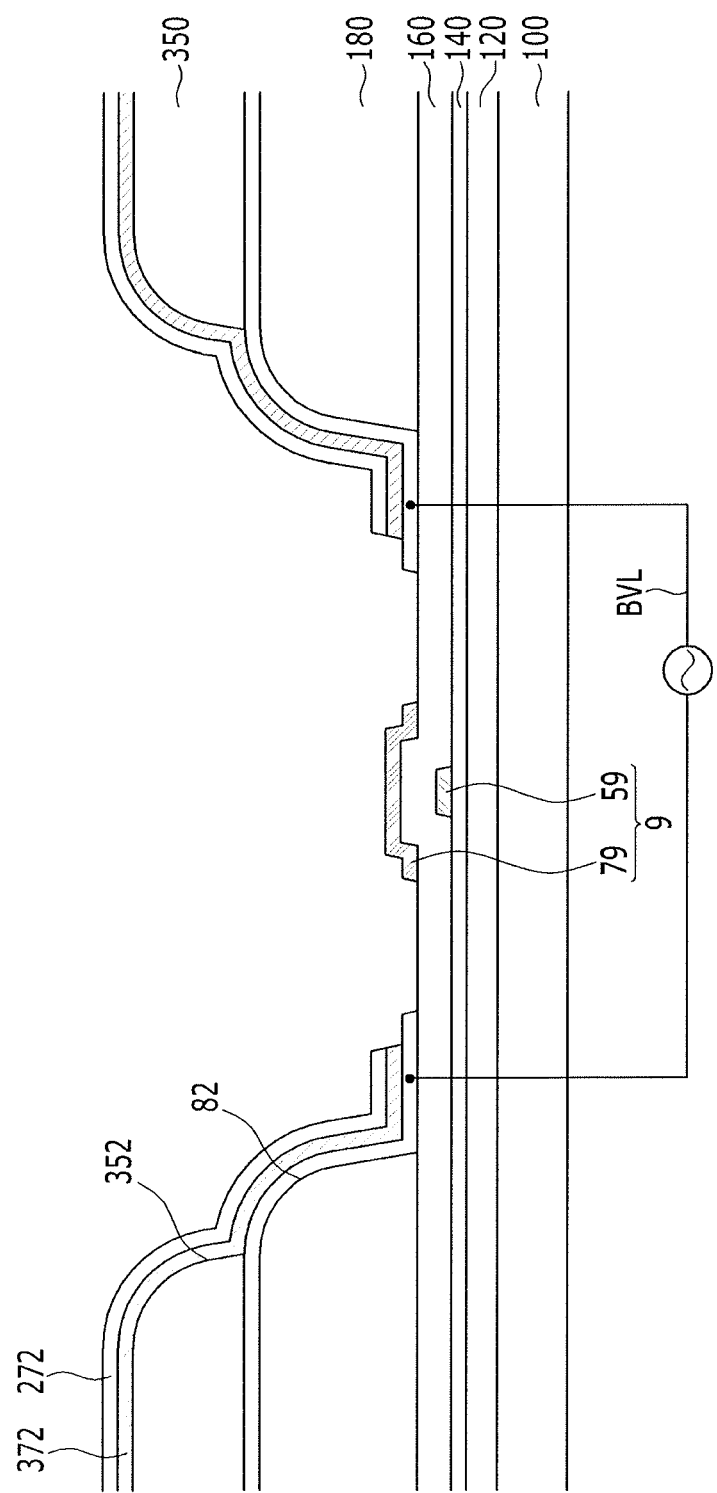
FIG. 18 illustrates a cross-sectional view taken along a line XVIII-XVIII of FIG. 17.

FIG. 17 illustrates a layout view showing a stage of a manufacturing method of an organic light emitting diode display according to another exemplary embodiment, and FIG. 18 is a cross-sectional view taken along a line XVIII-XVIII of FIG. 17.

The manufacturing method of the organic light emitting diode display according to the exemplary embodiment shown in FIG. 17 and FIG. 18 is substantially the same as the manufacturing method of the organic light emitting diode display according to an exemplary embodiment shown in FIG. 7, FIG. 8, FIG. 9, FIG. 10, FIG. 11, FIG. 12, and FIG. 13, except that the barrier member is formed between the first auxiliary electrode and the second auxiliary electrode.

First, as shown in FIG. 7, FIG. 8, FIG. 10, and FIG. 11, the buffer layer 120 may be formed on the substrate 110, and the semiconductor layer may be formed on the buffer layer 120. The semiconductor layer may undergo a photolithography process using the first mask, such that the semiconductor layer may be patterned into the semiconductor 130. The gate insulating layer 140 covering the buffer layer 120 and the semiconductor 130 may be formed thereon. The gate metal layer may be deposited on the gate insulating layer 140. The gate metal layer may be patterned through the photolithography process using the second mask. As a result, the first barrier member 59 may be formed in the pixel edge area P2. The source and drain doping having the higher doping concentration than the channel doping may be performed to the semiconductor 130. The interlayer insulating layer 160 covering the gate insulating layer 140 and the first barrier member 59 may be formed thereon. The gate insulating layer 140 and the interlayer insulating layer 160 may be patterned by a photolithography process using the third mask to form a plurality of contact holes 61, 62, 63, 64, 65, 66, 67, and 69 in the pixel area P1. The data metal layer may be formed on the interlayer insulating layer 160. The data metal layer may be patterned by the photolithography process using the fourth mask. Accordingly, the second barrier member 79 may be formed on the pixel edge area P2 of the interlayer insulating layer 160. The passivation layer 180 may be formed on the interlayer insulating layer 160, and the protection opening 82 exposing the barrier member 9 may be formed in the passivation layer 180 positioned at the pixel edge area P2 by the photolithography process using the fifth mask. The pixel electrode layer may be formed on the passivation layer 180 and patterned by the photolithography process using the sixth mask. The first auxiliary electrode 192a and the second auxiliary electrode 192b positioned at both sides via the barrier member 9 may be formed in the pixel edge area P2.

The pixel definition layer 350 covering the auxiliary electrode 192 may be formed on the passivation layer 180. The auxiliary opening 352 exposing the end of the auxiliary electrode 192 may be formed in the pixel definition layer 350 positioned at the pixel edge area P2 by using the seventh mask. The pixel emission layer 371 may be formed on the pixel electrode 191 exposed through the pixel opening 351 of the pixel definition layer 350, and the common emission layer 372 may be formed on the pixel emission layer 371 and the pixel definition layer 350. The auxiliary common electrode 272 may be formed on the common emission layer 372. The common emission layer 372 and the auxiliary common electrode 272 positioned on the barrier member 9 may be positioned at a higher height than other portions. Accordingly, the thickness t2 of the common emission layer 372 and the auxiliary common electrode 272 positioned on the barrier member 9 may be formed with a thinner thickness t1 than the other portions.

Next, as shown in FIG. 17 and FIG. 18, the breakdown voltage line BVL may be connected between the first auxiliary electrode 192a and the second auxiliary electrode 192b that are electrically separated from each other to apply the breakdown voltage. Thus, the breakdown voltage may be retained between the first auxiliary electrode 192a and the auxiliary common electrode 272, and the breakdown voltage may also be retained between the second auxiliary electrode 192b and the auxiliary common electrode 272. In this case, the thickness t2 of the common emission layer 372 and the auxiliary common electrode 272 positioned on the barrier member 9 may be thinner than the thickness t1 of the other portions such that the common emission layer 372 and the auxiliary common electrode 272 positioned on the barrier member 9 may be easily removed by the discharge due to the breakdown voltage, thereby forming the common contact hole 72. The end of the auxiliary electrode 192 may be exposed through the common contact hole 72. As described above, by forming the barrier member 9 at the position overlapping the auxiliary electrode 192, the common emission layer 372 and the auxiliary common electrode 272 may be formed on the auxiliary electrode 192 to have a thin thickness. Accordingly, the common emission layer 372 and the auxiliary common electrode 272 may be easily removed by the discharge due to the breakdown voltage.

In other implementations, a third barrier member may be formed between the first barrier member and the second barrier member.

Figure 19:
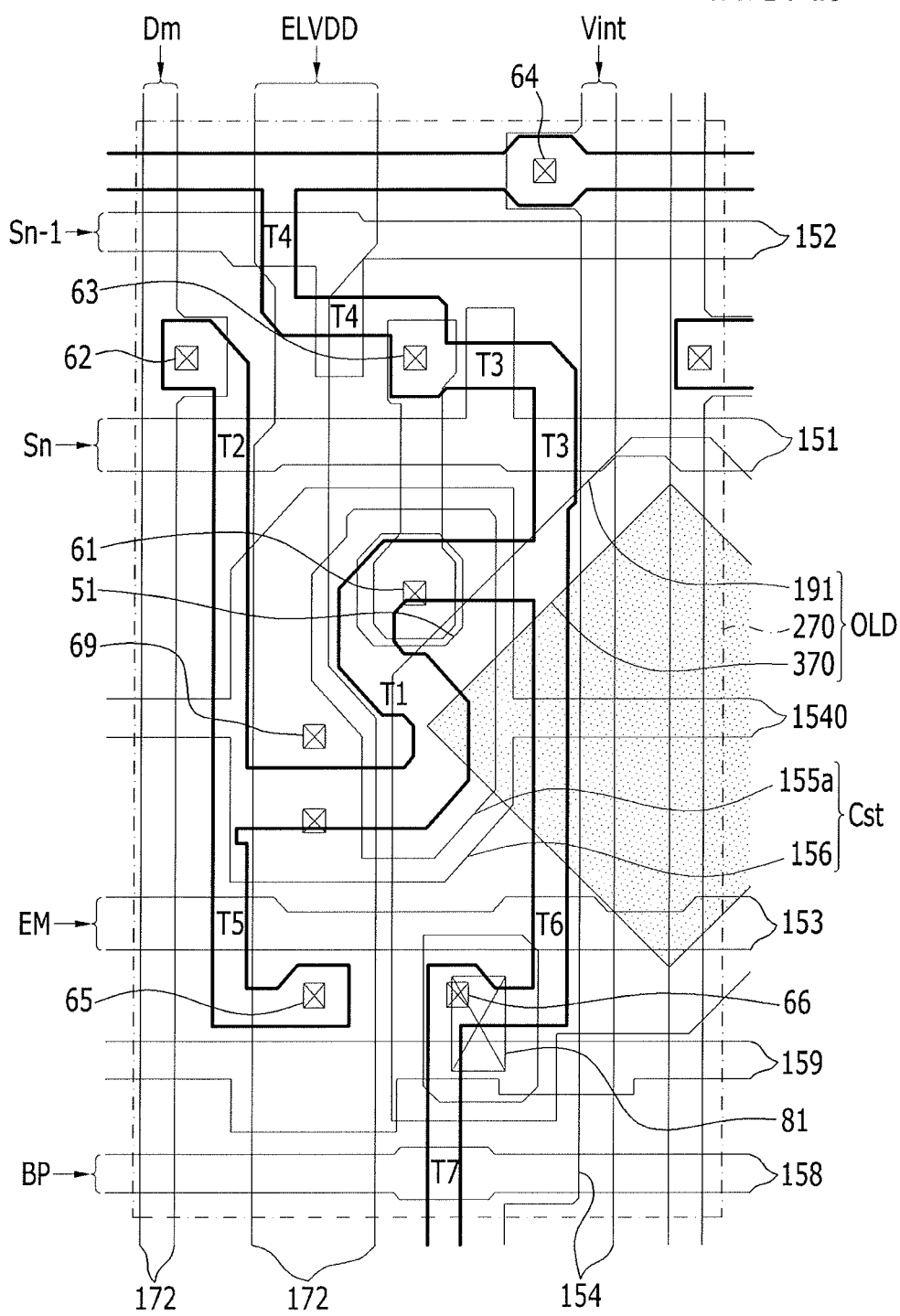
FIG. 19 illustrates a view of a plurality of transistor and a capacitor of an organic light emitting diode display according to another exemplary embodiment.
Figure 20:
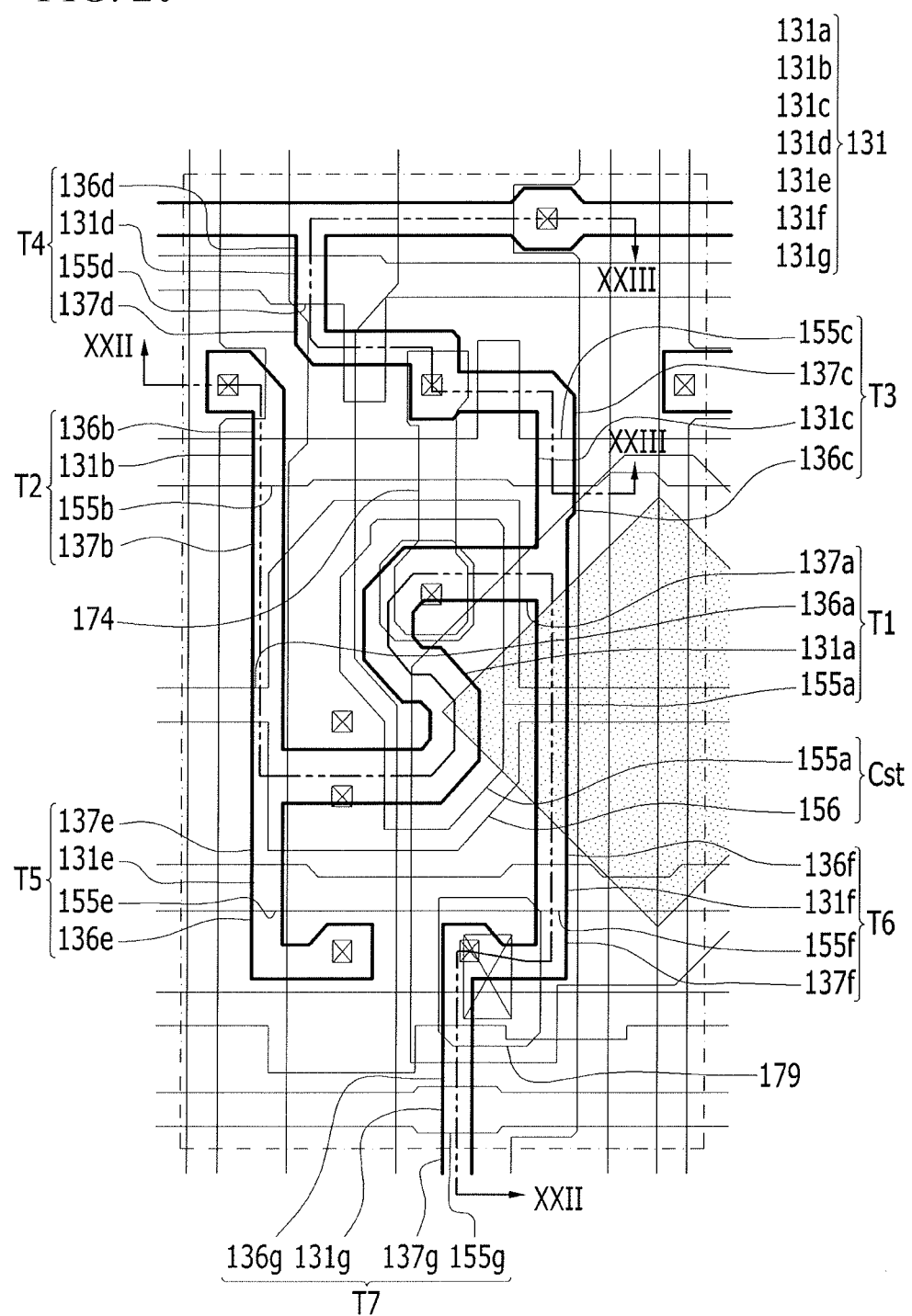
FIG. 20 illustrates a detailed layout view of FIG. 19.
Figure 21:
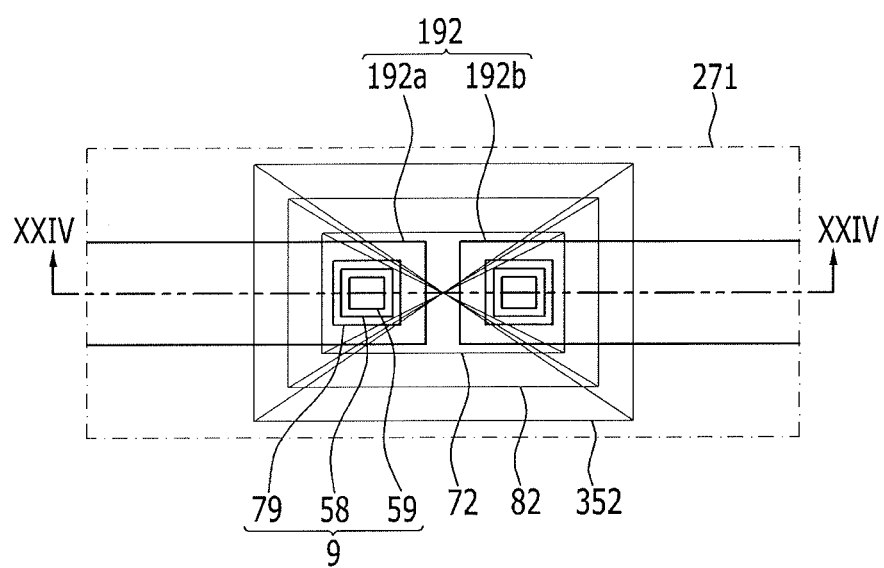
FIG. 21 illustrates a detailed layout view corresponding to a portion A of FIG. 5 of the exemplary embodiment.
Figure 22:
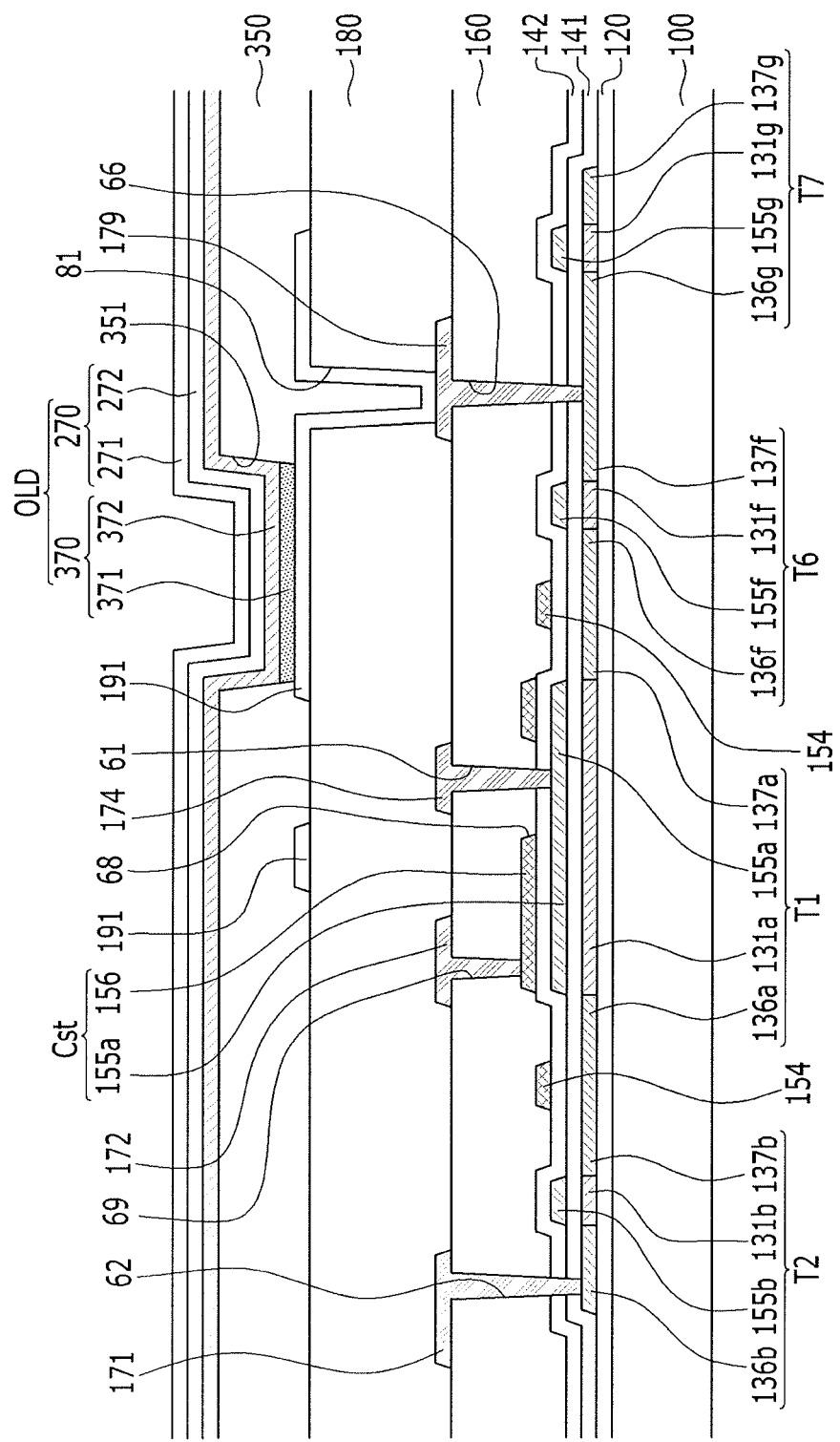
FIG. 22 illustrates a cross-sectional view taken along a line XXII-XXII of FIG. 20.
Figure 23:
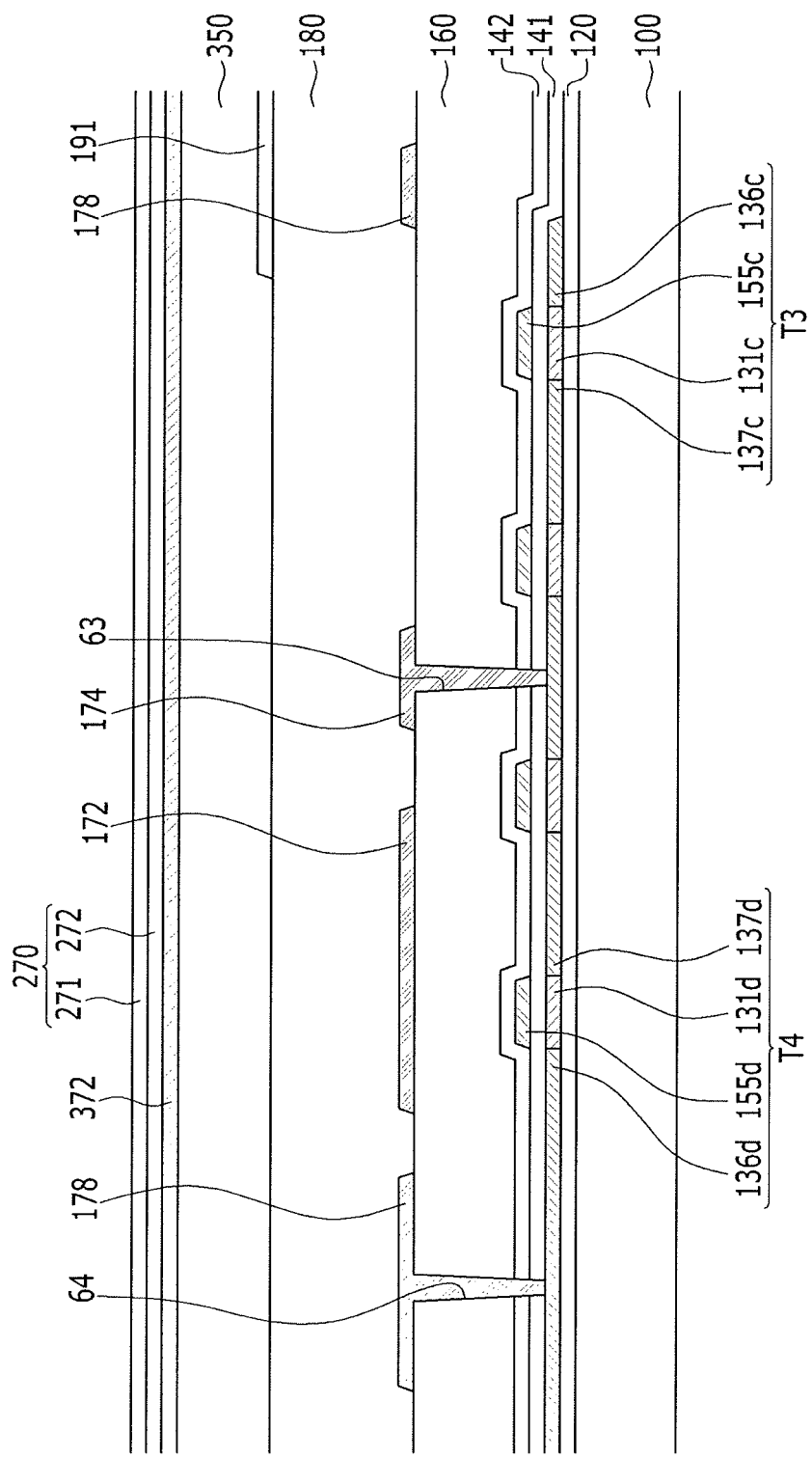
FIG. 23 illustrates a cross-sectional view taken along a line XXIII-XXIII of FIG. 20.
Figure 24:
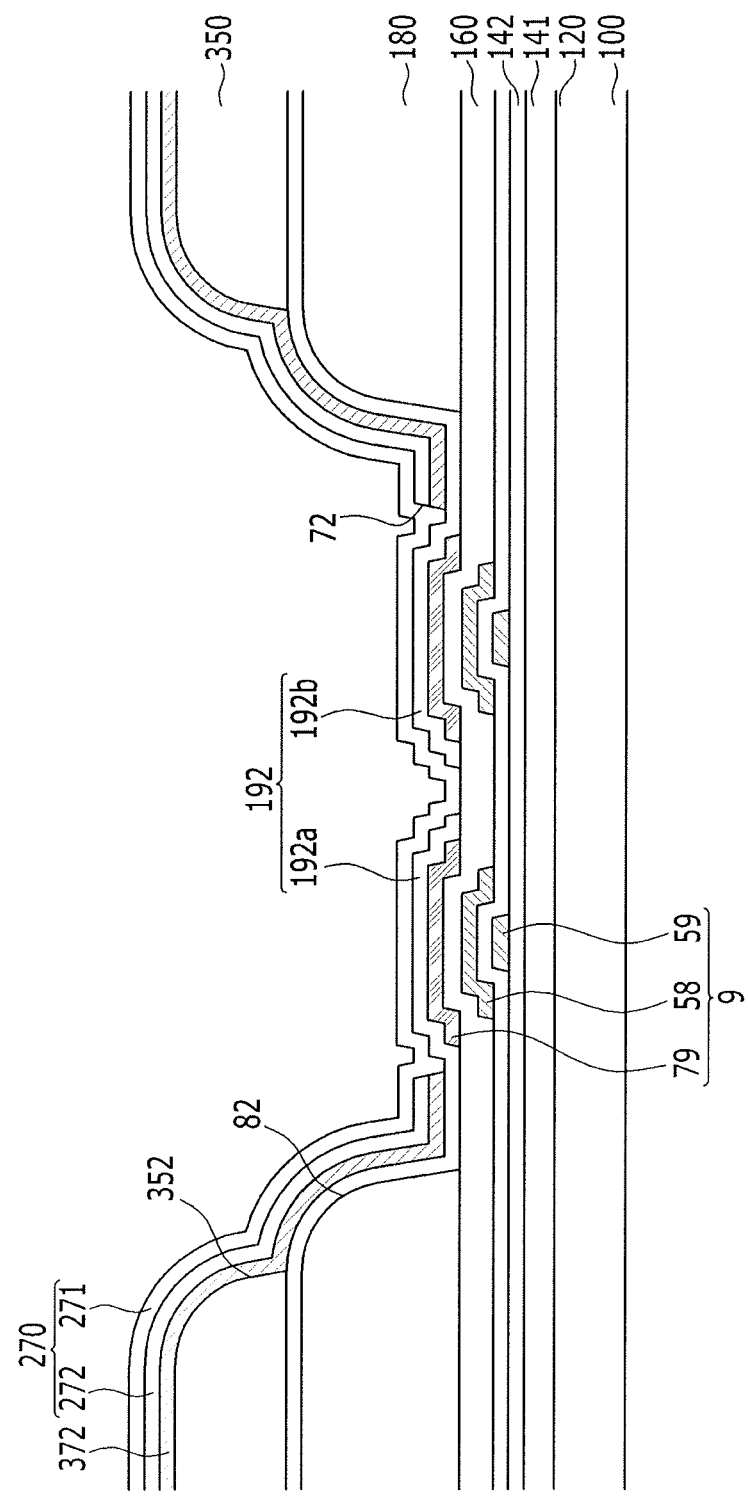
FIG. 24 illustrates a cross-sectional view taken along a line XXIV-XXIV of FIG. 21.

FIG. 19 illustrates a view of a plurality of transistors and a capacitor of an organic light emitting diode display according to another exemplary embodiment FIG. 20 illustrates a detailed layout view of FIG. 19. FIG. 21 illustrates a detailed layout view corresponding to a portion A of FIG. 5 of the exemplary embodiment, FIG. 22 illustrates a cross-sectional view taken along a line XXII-XXII of FIG. 20, FIG. 23 illustrates a cross-sectional view taken along a line XXIII-XXIII of FIG. 20, and FIG. 24 illustrates a cross-sectional view taken along a line XXIV-XXIV of FIG. 21.

The exemplary embodiment shown in FIG. 19, FIG. 20, FIG. 21, FIG. 22, FIG. 23, and FIG. 24 is substantially the same as the exemplary embodiment shown in FIG. 1 to FIG. 9 except for including a third barrier member. Accordingly, a description of substantially similar features will not be repeated.

As shown in FIG. 19, an organic light emitting diode display according to the current exemplary embodiment may include a scan line 151, a previous scan line 152, a light emission control line 153, and a bypass control line 158 respectively applying the scan signal Sn, the previous scan signal Sn−1, the light emission control signal EM, and the bypass signal BP and formed in the row direction. In this case, a repair line 159 for repairing may be disposed to be parallel to the scan line 151.

Also, a data line 171, a driving voltage line 172, and an initialization voltage line 178 crossing the scan line 151, the previous scan line 152, the emission control line 153, and the bypass control line 158 and respectively applying a data signal Dm, a driving voltage ELVDD, and an initialization voltage Vint to the pixel PX may be further included. In this case, the initialization voltage Vint may be transmitted from the initialization voltage line 178 to the compensation transistor T3 via the initialization transistor T4.

Further, a driving thin film transistor T1, a switching thin film transistor T2, a compensation thin film transistor T3, an initialization thin film transistor T4, an operation control thin film transistor T5, an emission control thin film transistor T6, a bypass thin film transistor T7, a storage capacitor Cst, and an organic light emitting diode OLD may be formed in the pixel PX. The organic light emitting diode OLD may include a pixel electrode 191, an organic emission layer 370, and a common electrode 270. The compensation transistor T3 and the initialization transistor T4 may be configured as a dual gate structure transistor in order to block a leakage current.

Channels of the driving transistor T1, the switching transistor T2, the compensation transistor T3, the initialization transistor T4, the operation control transistor T5, the light emission control transistor T6, and the bypass transistor T7 may be formed as one semiconductor 130 connected thereto, and the semiconductor 130 may be formed to be curved in various shapes. The semiconductor 130 may be made of a polycrystalline semiconductor material or an oxide semiconductor material.

As illustrated in FIG. 20, the channel 131 formed in the semiconductor 130 may include a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 may include the driving channel 131a, a driving gate electrode 155a, the driving source electrode 136a, and a driving drain electrode 137a. The driving channel 131a may be curved and may have a meandering shape or a zigzag shape. As such, by forming the curved driving channel 131a, the driving channel 131a may be formed to be elongated in a narrow space. Accordingly, a driving range of the driving gate-source voltage Vgs between the driving gate electrode 155a and the driving source electrode 136a may be increased by the elongated driving channel 131a. When the driving range of the gate voltage is increased, a gray scale of light emitted from the organic light emitting diode OLD may be finely controlled by changing the magnitude of the gate voltage. As a result, the resolution of the organic light emitting diode display device may be enhanced and display quality may be improved. Various examples such as 'reverse S', 'S', 'M', and 'W' may be implemented by variously modifying the shape of the driving channel 131a.

The driving gate electrode 155a may overlap with the driving channel 131a. The driving source electrode 136a and the driving drain electrode 137a may be formed close by at respective sides of the driving channel 131a. The driving gate electrode 155a may be connected to a first driving connecting member 174 through a contact hole 61.

The switching transistor T2 may include the switching channel 131b, a switching gate electrode 155b, a switching source electrode 136b, and a switching drain electrode 137b. The switching gate electrode 155b, which is a part extended downward from the scan line 151, may overlap with the switching channel 131b. The switching source electrode 136b and the switching drain electrode 137b may be formed close by at respective sides of the switching channel 131b. The switching source electrode 136b may be connected with the data line 171 through a contact hole 62.

The compensation transistor T3 may include the compensation channel 131c, a compensation gate electrode 155c, a compensation source electrode 136c, and a compensation drain electrode 137c.

Two compensation transistors T3 may be formed in order to prevent a leakage current. Two compensation gate electrodes 155c may respectively be a portion of the scan line 151 and a protrusion extended upwardly from the scan line 151. The compensation gate electrode 155c may overlap the compensation channel 131c. The compensation source electrode 136c and the compensation drain electrode 137c may be respectively formed to be adjacent to both sides of the compensation channel 131c. The compensation drain electrode 137c may be connected to the driving connecting member 174 through a contact hole 63.

The initialization transistor T4 may include the initialization channel 131d, an initialization gate electrode 155d, an initialization source electrode 136d, and an initialization drain electrode 137d. Two initialization transistors T4 may be formed in order to prevent a leakage current. Two initialization gate electrodes 155d may respectively be a portion of the previous scan line 152 and a protrusion extended downwardly from the previous scan line 152. The initialization gate electrode 155d may overlap the initialization channel 131d. The initialization source electrode 136d and the initialization drain electrode 137d may be respectively formed to be adjacent to both sides of the initialization channel 131d. The initialization source electrode 136d may be connected to the initialization connecting member 175 through a contact hole 64, and the initialization drain electrode 137d may be connected to the driving connecting member 174 through the contact hole 63.

The operation control transistor T5 may include the operation control channel 131e, an operation control gate electrode 155e, an operation control source electrode 136e, and an operation control drain electrode 137e. The operation control gate electrode 155e, which is a part of the light emission control line 153, may overlap with the operation control channel 131e. The operation control source electrode 136e and the operation control drain electrode 137e may be formed close by at respective sides of the operation control channel 131e. The operation control source electrode 136e may be connected with a part of the driving voltage line 172 through a contact hole 65.

The light emission control transistor T6 may include the light emission control channel 131f, a light emission control gate electrode 155f, a light emission control source electrode 136f, and a light emission control drain electrode 137f. The light emission control gate electrode 155f, which is a part of the light emission control line 153, may overlap with the light emission control channel 131f. The emission control source electrode 136f and the emission control drain electrode 137f may be formed close by at respective sides of the emission control channel 131f. The light emission control drain electrode 137f may be connected with an emission control connecting member 179 through a contact hole 66.

The bypass transistor T7 may include the bypass channel 131g, a bypass gate electrode 155g, a bypass source electrode 136g, and a bypass drain electrode 137g. The bypass gate electrode 155g, which is a part of the bypass control line 158, may overlap with the bypass channel 131g. The bypass source electrode 136g and the bypass drain electrode 137g may be formed close by at respective sides of the bypass channel 131g. The bypass source electrode 136g may be connected to the emission control connecting member 179 through the emission control contact hole 66, and the bypass drain electrode 137g may be connected directly to the initialization source electrode 136d.

One end of the driving channel 131a of the driving transistor T1 may be connected to the switching drain electrode 137b and the operation control drain electrode 137e, and the other end of the driving channel 131a may be connected to the compensation source electrode 136c and the emission control source electrode 136f.

The storage capacitor Cst may include the first storage electrode 155a and a second storage electrode 156, which are disposed with a second insulating layer 142 therebetween. The first storage electrode 155a may correspond to the driving gate electrode 155a, and the second storage electrode 156 may be a portion extended from a storage line 1540, and occupies a larger area than the driving gate electrode 155a, and fully covers the driving gate electrode 155a. Herein, the second insulating layer 142 may be a dielectric material, and a storage capacitance may be determined by charges stored in the storage capacitor Cst and a voltage between the two electrodes 155a and 156. As such, the driving gate electrode 155a may be used as the first storage electrode 155a. It may be possible to ensure a space in which the storage capacitor may be formed within a space narrowed by the driving channel 131a having a large area in the pixel.

The first storage electrode 155a, which is also the driving gate electrode 155a, may be connected with one end of the first data connecting member 174 through the contact hole 61 and a storage opening 51. The storage opening 51 may be formed in the second storage electrode 156.

The first data connection member 174 may be formed on the same layer as and to be substantially parallel with the data line 171. Another end of the first data connection member 174 may be connected with the second compensation drain electrode 137c of the second compensation transistor T3 and the second initialization drain electrode 137d of the second initialization transistor T4 through the contact hole 63. Accordingly, the first data connection member 174 may connect the driving gate electrode 155a and the second compensation drain electrode 137c of the second compensation transistor T3, and the second initialization drain electrode 137d of the second initialization transistor T4, to each other.

The second storage electrode 156 may be connected with the driving voltage line 172 through a contact hole 69.

The storage capacitor Cst may store a storage capacitance corresponding to a difference between the driving voltage ELVDD transferred to the second storage electrode 156 through the driving voltage line 172 and the gate voltage Vg of the driving gate electrode 155a.

The initialization voltage line 178 extending to be parallel to the data line 171 may be connected to the initialization source electrode 176d through the contact hole 64.

The emission control connecting member 179 may have a quadrangle shape and may be connected to the pixel electrode 191 through a contact hole 81.

An organic emission layer 370 may be formed on the pixel electrode 191. The organic emission layer 370 may include a pixel emission layer 371 and a common emission layer 372. The pixel emission layer 371 may be formed only in the pixel of a corresponding color. The common emission layer 372 may be commonly formed in all of the pixels. A common electrode 270 may be formed on the organic emission layer 370. The common electrode 270 may include an auxiliary common electrode 272 and a main common electrode 271 that are sequentially deposited.

As shown in FIG. 5, a plurality of pixel electrode 191 may be disposed approximately in to matrix at the pixel area P1. The auxiliary electrode 192 may be formed in a mesh structure at the pixel edge area P2 between the pixel electrodes 191. The auxiliary electrode 192 may be connected with the common electrode 270 to reduce the resistance of the common electrode 270, thereby preventing a voltage drop of the common electrode 270. Next, a structure of the common contact portion A positioned at the pixel edge area P2 and connecting the auxiliary electrode 192 and the common electrode 270 to each other will be described in detail with reference to FIG. 21.

As shown in FIG. 21, the auxiliary electrode 192 may be divided into a first auxiliary electrode 192a and a second auxiliary electrode 192b. A barrier member 9 may be formed at the position corresponding to an end of the auxiliary electrode 192. The barrier member 9 includes a first barrier member 59, a second barrier member 79, and a third barrier member 58. The third barrier member 58 may be formed between the first barrier member 59 and the second barrier member 79, and may overlap the first barrier member 59 and the second barrier member 79. The end of the auxiliary electrode 192 on the barrier member 9 may be formed to be higher compared with other portions of the auxiliary electrode 192. For example, the barrier member 9 may have a higher height than the barrier member 9 shown in FIG. 6 and FIG. 9. Accordingly, the common emission layer 372 and the auxiliary common electrode 272 formed on the auxiliary electrode 192 may be formed with the thinner thickness such that the common emission layer 372 and the auxiliary common electrode 272 may be more easily removed.

The auxiliary common electrode 272 and the common emission layer 372 together may have a common contact hole 72 exposing the auxiliary electrode 192 The main common electrode 271 may be connected with the auxiliary electrode 192 through the common contact hole 72 and the auxiliary opening 352.

Hereinafter, the cross-sectional structures of the organic light emitting diode display device according to another exemplary embodiment will be described in detail according to a stacking order with reference to FIG. 22, FIG. 23, and FIG. 24.

A buffer layer 120 may be formed on a substrate 110. A semiconductor 130 including a driving channel 131a, a switching channel 131b, a compensation channel 131c, an initialization channel 131d, an operation control channel 131e, a light emission control channel 131f, a first storage electrode 132, and a first boosting electrode 133 may be formed on the buffer layer 120 of the pixel area P1. A driving source electrode 136a and a driving drain electrode 137a may be formed on respective sides of the driving channel 131a in the semiconductor 130, and a switching source electrode 136b and a switching drain electrode 137b may be formed on respective sides of the switching channel 131b. The compensation source electrode 136c and the compensation drain electrode 137c may be formed at both sides of the compensation channel 131c, and the initialization source electrode 136d and the initialization drain electrode 137d may be formed at both sides of the initialization channel 131d. The operation control source electrode 136e and the operation control drain electrode 137e may be formed at both sides of the operation control channel 131e, and the light emission control source electrode 136f and the light emission control drain electrode 137f may be formed at both sides of the light emission control channel 131f. The bypass source electrode 136g and the bypass drain electrode 137g may be formed at both sides of the bypass channel 131g.

A first gate insulating layer 141 covering the semiconductor 130 may be formed thereon. A scan line 151 including a switching gate electrode 155b and a compensation gate electrode 155c, a previous scan line 152 including an initialization gate electrode 155d, a light emission control line 153 including an operation control gate electrode 155e and a light emission control gate electrode 155f, a bypass control line 158 including a bypass gate electrode 155g, and a driving gate electrode (a first storage electrode) 155a may be formed on the first gate insulating layer 141. A pair of first barrier members 59 may be formed on the first gate insulating layer 141 positioned at the pixel edge area P2.

A second gate insulating layer 142 covering the first gate wires 151, 152, 153, 155a, and 59 and the first gate insulating layer 141 may be formed thereon. The first gate insulating layer 141 and the second gate insulating layer 142 may be formed of a silicon nitride (SiNx) or a silicon oxide (SiOx).

A storage line 1540 disposed to be parallel to the scan line 151, a second storage electrode 156 at a part extended from the storage line 1540, and a repair line 159 disposed to be parallel to the scan line 151 may be formed on the second gate insulating layer 142. A pair of third barrier members 58 may be formed on the second gate insulating layer 142 positioned at the pixel edge area P2.

An interlayer insulating layer 160 may be formed on the storage line 1540, the second storage electrode 156, the repair line 159, the third barrier members 58, and the second gate insulating layer 142. The interlayer insulating layer 160 may be formed of a silicon nitride (SiNx) or a silicon oxide (SiOx).

The interlayer insulating layer 160 may include contact holes 61, 62, 63, 64, 65, 66, and 69. A data line 171, a driving voltage line 172, a driving connecting member 174, an initialization voltage line 178, and a light emission control connecting member 179 may be formed on the interlayer insulating layer 160. A pair of second barrier members 79 may be formed on the interlayer insulating layer 160 positioned in the pixel edge area P2. The second barrier member 79 may overlap the first barrier member 59 and the third barrier member 58. The second barrier member 79 may cover both the first barrier member 59 and the third barrier member 58. The first barrier member 59, the second barrier member 79, and the third barrier member 58 may together form a barrier member 9.

The data line 171 may be connected to the switching source electrode 136b through the contact hole 62 formed in the first gate insulating layer 141, the second gate insulating layer 142, and the interlayer insulating layer 160. One end of the driving connecting member 174 may be connected to the first storage electrode 155a through the contact hole 61 formed in the second gate insulating layer 142 and the interlayer insulating layer 160. The other end of the driving connecting member 174 may be connected to the compensation drain electrode 137c and the initialization drain electrode 137d through the contact hole 63 formed in the first gate insulating layer 141, the second gate insulating layer 142, and the interlayer insulating layer 160.

The initialization voltage line 178 may be connected to the initialization source electrode 136d through the contact hole 64 formed in the first gate insulating layer 141, the second gate insulating layer 142, and the interlayer insulating layer 160.

The emission control connecting member 179 may be connected to the emission control drain electrode 137f through the contact hole 66 formed in the first gate insulating layer 141, the second gate insulating layer 142, and the interlayer insulating layer 160.

The data wires 171, 172, 174, 178, and 179 may be formed as a triple layer of titanium/aluminum/titanium (Ti/Al/Ti), molybdenum/aluminum/molybdenum (Mo/Al/Mo), or molybdenum/copper/molybdenum (Mo/Cu/Mo).

A passivation layer 180 covering the data wires 171, 172, 174, 178, and 179 and the interlayer insulating layer 160 may be formed thereon. The passivation layer 180 may be formed as an organic layer. The passivation layer 180 positioned at the pixel edge area P2 may include a protection opening 82 exposing the barrier member 9.

A pixel electrode 191 and an auxiliary electrode 192 may be formed on the passivation layer 180. The light emission control connecting member 179 may be connected to the pixel electrode 191 through the contact hole 81 formed in the passivation layer 180. The auxiliary electrode 192 may be separated into a first auxiliary electrode 192a and a second auxiliary electrode 192b. The ends of the first auxiliary electrode 192a and the second auxiliary electrode 192b may be formed at positions corresponding to a pair of the barrier members 9. The ends of the first auxiliary electrode 192a and the second auxiliary electrode 192b may be directly connected with the pair of barrier members 9 exposed through the protection opening 82.

A pixel definition layer (PDL) 350 covering the passivation layer 180, the auxiliary electrode 192, and the edge of the pixel electrode 191 may be formed thereon. The pixel definition layer 350 may include a pixel opening 351 exposing the pixel electrode 191 and an auxiliary opening 352 exposing the end of the auxiliary electrode 192. The barrier member 9 may be positioned at the auxiliary opening 352 of the pixel definition layer 350. By maximally expanding the auxiliary opening 352, the steps of the common emission layer 372, the auxiliary common electrode 272, and the main common electrode 271 formed on the pixel definition layer 350 may be minimized such that the contact between the main common electrode and the auxiliary electrode 192 may be facilitated.

The organic emission layer 370 may be formed on the pixel electrode 191 exposed by the pixel opening 351. The organic emission layer 370 may include a pixel emission layer 371 formed in the pixel area P1 and a common emission layer 372 formed to the pixel edge area P2. A common electrode 270 may be formed on the organic emission layer 370. The common electrode 270 may include an auxiliary common electrode 272 formed in the pixel area P1 and the portion of the pixel edge area P2, and a main common electrode 271 formed in the entire surface including the pixel area P1 and the pixel edge area P2.

The common emission layer 372 and the auxiliary common electrode 272 together may have a common contact hole 72 exposing the end of the auxiliary electrode 192. When the main common electrode 271 is directly connected with the auxiliary electrode 192 exposed through the common contact hole 72 and the auxiliary opening 352, the resistance of the common electrode 270 may be reduced, thereby helping to prevent a voltage drop of the common electrode 270.

By way of summation and review, in a large-sized organic light emitting diode display, it is desirable to minimize the resistance of the cathode. An auxiliary electrode that is connected with the cathode may be formed in a pixel edge area. To simplify a manufacturing process and to reduce the number of masks, a portion among an organic emission layer emitting red, green, and blue may be commonly formed in all pixels. As described above, in the structure in which a common emission layer is commonly formed in all pixels, when the common emission layer is formed in the pixel edge area, the common emission layer must be removed to connect the cathode and the auxiliary electrode to each other.

A high resistance material may be inserted in the auxiliary electrode to remove the common emission layer, however an additional process to insert the high resistance material is required, and the common emission layer is not normally removable when a resistance difference between the high resistance material and the low resistance material is not sufficiently large.

Embodiments provide an organic light emitting diode display in which a resistance increase of a common electrode applied to a large-sized top emission type of light emission structure is avoided or prevented, and a manufacturing method thereof.

According to embodiments, by forming a barrier member at a position overlapping the auxiliary electrode, the common emission layer and the auxiliary common electrode formed on the auxiliary electrode may be formed with a sufficiently thin thickness such that the common emission layer and the auxiliary common electrode formed on the auxiliary electrode may be removed by a discharge resulting from applying a breakdown voltage.

Accordingly, by forming the auxiliary electrode having the low resistance at the common electrode, the resistance of the common electrode may be minimized to be applied to the top emission type of light emission structure of a large size, thereby realizing a power consumption reduction, life prolongation, and light efficiency improvement.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting diode display, comprising:
a substrate;
a plurality of switching elements on the substrate;
at least one barrier member on the substrate;
a passivation layer covering the plurality of switching elements, the passivation layer including a protection opening exposing the barrier member;
a plurality of pixel electrodes on the passivation layer, the pixel electrodes being connected to the switching elements;
a plurality of auxiliary electrodes separated from and formed from a same layer as the plurality of pixel electrodes;
an organic emission layer including a pixel emission layer and a common emission layer sequentially formed on the plurality of pixel electrodes; and
a common electrode including an auxiliary common electrode and a main common electrode sequentially formed on the common emission layer,
wherein the common emission layer and the auxiliary common electrode have a common contact hole at a position corresponding to a position of the barrier member, and
the main common electrode is connected with an auxiliary electrode of the plurality of auxiliary electrodes through the common contact hole, wherein:
the substrate includes a plurality of pixel areas and a plurality of pixel edge areas between the plurality of pixel areas, and
the barrier member, the protection opening, and the auxiliary electrode are located at a pixel edge area of the plurality of pixel edge areas.

2. The organic light emitting diode display as claimed in claim 1, wherein:
the auxiliary electrode includes a first auxiliary electrode and a second auxiliary electrode separated from each other, the first auxiliary electrode and the second auxiliary electrode including ends that face each other.

3. The organic light emitting diode display as claimed in claim 2, wherein:
the auxiliary electrode overlaps the barrier member.

4. The organic light emitting diode display as claimed in claim 2, wherein:
the barrier member is positioned between the first auxiliary electrode and the second auxiliary electrode.

5. The organic light emitting diode display as claimed in claim 4, wherein:
the barrier member is exposed through the protection opening and the common contact hole, and
the main common electrode is connected with the barrier member.

6. The organic light emitting diode display as claimed in claim 2, further comprising:
a pixel definition layer covering a pixel electrode of the plurality of pixel electrodes and the auxiliary electrode, the pixel definition layer including an auxiliary opening exposing a portion of the auxiliary electrode, and
the barrier member is positioned at the auxiliary opening.

7. The organic light emitting diode display as claimed in claim 6, wherein:
the main common electrode is connected with the auxiliary electrode exposed through the auxiliary opening and the common contact hole.

8. The organic light emitting diode display as claimed in claim 7, wherein
the auxiliary electrode exposed through the auxiliary opening is connected with the common emission layer.

9. The organic light emitting diode display as claimed in claim 1, further comprising:
a scan line formed on the substrate and transmitting a scan signal to a switching element of the plurality of switching elements; and
a data line crossing the scan line and transmitting a data signal to the switching element, and wherein,
the barrier member includes a first barrier member formed from a same layer as the scan line, and a second barrier member overlapping the first barrier member and formed from a same layer as the data line.

10. The organic light emitting diode display as claimed in claim 9, wherein the switching element includes:
a switching transistor connected to the scan line and the data line, and
a driving transistor connected to the switching transistor.

11. The organic light emitting diode display as claimed in claim 9, further comprising:
a third barrier member between the first barrier member and the second barrier member, the third barrier member overlapping the first barrier member and the second barrier member.

12. A method for manufacturing an organic light emitting diode display, the method comprising:
forming a plurality of switching elements and at least one barrier member on a substrate;
forming a passivation layer covering a plurality of switching elements the passivation layer including a protection opening exposing the barrier member;
forming a plurality of pixel electrodes on the passivation layer, a pixel electrode of the plurality of pixel electrodes being connected to a switching element of the plurality of switching elements;
forming a plurality of auxiliary electrodes spaced apart from the plurality of pixel electrodes on the passivation layer, an auxiliary electrode of the plurality of auxiliary electrodes including a first auxiliary electrode and a second auxiliary electrode;
forming an organic emission layer sequentially including a pixel emission layer and a common emission layer on the plurality of pixel electrodes;
forming an auxiliary common electrode on the common emission layer;
forming a common contact hole through the common emission layer and the auxiliary common electrode, the common contact hole exposing a portion of the auxiliary electrode; and
forming a main common electrode on the auxiliary common electrode, the main common electrode being connected with the auxiliary electrode through the common contact hole,
wherein
the substrate includes a plurality of pixel areas and a plurality of pixel edge areas formed between a plurality of pixel areas, and
the barrier member, the protection opening, and the auxiliary electrode are formed at a pixel edge area of the plurality of pixel edge areas.

13. The method as claimed in claim 12, wherein:
the first auxiliary electrode is formed to be electrically separated from the second auxiliary electrode, and
forming the common contact hole includes applying a breakdown voltage between the first auxiliary electrode and the second auxiliary electrode to enable removal of the common emission layer and the auxiliary common electrode on the barrier member.

14. The method as claimed in claim 12, wherein
the first auxiliary electrode and the second auxiliary electrode are formed to be equipotentially connected, and
forming the common contact hole includes applying breakdown voltage between the auxiliary electrode and the auxiliary common electrode to enable removal the common emission layer and the auxiliary common electrode on the barrier member.

15. The method as claimed in claim 12, wherein:
the barrier member and the auxiliary electrode are formed to be in an overlapping relationship.

16. The method as claimed in claim 12, wherein:
the barrier member is formed between the first auxiliary electrode and the second auxiliary electrode.

17. The method as claimed in claim 12, further comprising:
forming a pixel definition layer covering the pixel electrode and the auxiliary electrode and having an auxiliary opening exposing a portion of the auxiliary electrode,
wherein the barrier member is positioned at the auxiliary opening.

18. The method as claimed in claim 17, wherein:
the main common electrode is connected with the auxiliary electrode exposed through the auxiliary opening and the common contact hole.

19. The method as claimed in claim 18, wherein
the auxiliary electrode exposed through the auxiliary opening is connected with the common emission layer.

* * * * *